United States Patent [19]

Johnson et al.

[11] Patent Number: 4,657,621
[45] Date of Patent: Apr. 14, 1987

[54] LOW PARTICULATE VACUUM CHAMBER INPUT/OUTPUT VALVE

[75] Inventors: Randall E. Johnson, Carrollton; Louis E. Peters, Dallas; Lowell E. Simmons, Garland, all of Tex.

[73] Assignee: Texas Instruments Incorporated, Dallas, Tex.

[21] Appl. No.: 663,908

[22] Filed: Oct. 22, 1984

[51] Int. Cl.⁴ .................. H01L 21/306; B44C 1/22; C03C 15/00; C23F 1/02
[52] U.S. Cl. .................. 156/345; 156/659.1
[58] Field of Search .................. 427/38, 39; 156/345, 156/643, 646, 656, 657, 659.1, 662, 665; 204/164, 192 EC, 192 E, 298; 118/728, 729, 50.1, 620

[56] References Cited

U.S. PATENT DOCUMENTS

| | | |
|---|---|---|
| 3,757,733 | 9/1973 | Reinberg .................. 118/725 |
| 4,313,783 | 2/1982 | Davies et al. .................. 156/643 |
| 4,318,767 | 3/1982 | Hijikata et al. .................. 156/345 |
| 4,341,582 | 7/1982 | Kohman et al. .................. 156/345 |
| 4,422,896 | 12/1983 | Class et al. .................. 156/643 |
| 4,526,670 | 7/1985 | Hajj .................. 156/643 X |

Primary Examiner—William A. Powell
Attorney, Agent, or Firm—Frederick J. Telecky, Jr.; Leo N. Heiting; Melvin Sharp

[57] ABSTRACT

A low particulate vacuum chamber semiconductor wafer input/output valve minimizes the particulate generation by taking advantage of a camming motion at the instant of closing to insure that the valve closes normal to the reaction chamber wall. This eliminates any friction between a glandular seal in the vacuum chamber wall. As the valve closes, it strikes a stop which causes a 90 degree change in direction of the valve forcing it into tape cut. This change of direction is accomplished through a combination of an upper motion of a backing plate, and a spring-loaded linkage in stock. As the gate closes there is some particulte generated at the interface of the valve plate and the stop. This is handled by placing the area of contact outside the transportation path for the semiconductor wafer.

6 Claims, 35 Drawing Figures

LOW PARTICULATE VACUUM CHAMBER INPUT/OUTPUT VALVE

BACKGROUND OF THE INVENTION

This invention relates to a semiconductor manufacturing apparatus and in particular to a semiconductor manufacturing apparatus in which circuit patterns are etched on a semiconductor wafer by a plasma reaction.

This invention relates to TI copending U.S. Patent application Ser. Nos.: 663,907; 663,901; 664,448; 663,903; 663,904; 663,804; 663,805; 663,905; 663,906; and 663,909 which by reference are incorporated herein. Copending application Ser. No. 664,448 was filed on Oct. 24, 1984 while the other copending cases were all filed on Oct. 22, 1984.

The manufacturing of semiconductor devices such as a 256K RAM or even up to a 1 megabit RAM device require precision dry etching with high repeatability, low particulate levels, reliable endpoint detection, multiple process capability and reliable feedback control to a microprocessor controller for reliable systems execution. An example of a prior art plasma reactor system is described in U.S. Pat. No. 3,757,733 which is assigned to the assignee of the present invention.

In the prior art systems, the transportation of silicon wafers through a plasma reactor required an opening in the reactant chamber that is large enough for the wafer to pass through. The mechanism that are typically used create particles that potentially impact yeild of devices of the semiconductor wafers that are processed.

Chlorine and bromine gases which are typically used in the process during plasma etching are highly corrosive to the components that are used to build the plasma reactors. Over a long term operation, reactor components exposed to the plasma must be constructed of materials that are resistance to the corrosive effects of the plasma. Aluminum is an excellent material of construction for a plasma reactor, especially when it is protected by anodization. However, during etching, when a semiconductor or silicon wafer is placed on a substrate assembly that is anodized and used as an electrode, the substrate is protected from the plasma by the silicon wafer. However, each silicon wafer has a slice or flat to allow for crystallographic orientation. If the slice is placed on the substrate with random orientation of the flat, an annulus of equal width of the flat width plus the placement tolerance will in general be exposed to the plasma. Anodizing the whole substrate is impractical in that it is conductive towards the RF electrical power used in the plasma reactor. However, it is an insulator towards DC. It is known that electrically floating objects such as silicon wafers covered with oxides exposed to a plasma will acquire an electrical potential, the floating potential, above the ground of the system. It has been observed in production that an electrostatic repulsion develops between the wafer and the semiconductor substrate causing the wafer to randomly drift off its alignment position on the substrate.

Although several commercially available automatic wafer etch reactors use a confined plasma, none of the known systems provide a small gap which will not support a plasma and therefore confine the plasma within the small gap, use the same gap for both pumping the exhaust of gases from the reactors and for transporting the semiconductor wafers into the reactant chamber and thus keeping the reactant chamber simple and free of poorly controlled dead space within the reactor chamber.

Additionally, it has been determined that the gap between the collimator or electrode and substrate during process should be approximately around 0.040 inch for oxide processing. With a non-load locked system, the process chamber is vented to atmosphere which allows the electrode and collimator to move up to between 0.030 and 0.040 inch and the semiconductor wafer passes under the collimator. This is unreliable due to the fact that an inconsistent gap can now be achieved and the slice levitation varies, also, an automatic transportation system is impractical with the above operation. And in particular, the single slice dioxide and oxide etch processes have historically used the highest possible density to remove silicon dioxide. This elevated power density is far more difficult to control than any other type of etching operation. Also, highly selective etch processing often builds up deposits in the reactors. For this reason, these processes have tended to be limited in commercial applications.

SUMMARY OF THE INVENTION

A plasma etch system that processes one slice at a time is disclosed. The system is comprised of an entry loadlock, an exit loadlock, a main chamber, vacuum pumps, RF power supply, RF matching network, a heat exchanger, throttle valve and pressure control gas flow distribution and a microprocessor controller. A multiple slice cassette full of slices is housed in the entry load lock and after pumping to process pressure, a single slice at a time is moved by an articulated arm from the cassette through an isolation gate to the main process chamber. The slice is etched and removed from the main process chamber through a second isolation gate by a second articulated arm to a cassette in the exit loadlock. The process is repeated until all semiconductor wafers have been etched. The cassette loadlock system is able to evacuate a whole cassete of semiconductor wafers for processing which lowers the particulate environment for the slices and, provides a more stable environment for the slices by removal of moisture and preventing static discharges and additonally provides a safety feature that protects the operators from harsh or toxic gases that are traditionally used in semiconductor type plasma reactors.

This novel feature enables clean slice handling and eliminates the problem that traditionally occurs in the manufacturing of semiconductor devices in that there are no airtracks on the devices, no rubbing of the parts or semiconductor wafers. The semiconductor wafers are lifted off the cassette slot before movement and all belts, pulleys or drives are either external to the chamber or shielded within the main reactor chambers. The movement of the slices through the process is tracked with sensors.

The cassette loadlock apparatus according to the invention is a closed loop feedback process control system which insures that adequate pressure within the entry loadlock, the exit loadlock and the main chamber are controlled by microprocessor. The RF power during the reaction of the manufacturing process is monitored and controlled by a microprocessors. Gas flows are monitored and controlled by the microprocessor through mass flow controllers. End of etch is monitored and controlled by the microprocessor through a novel endpoint detection scheme.

The invention provides a multiple process capability by which multiple menus can be applied to a single slice in situ to achieve special etch profiles and other special processing requirements such as high selectivity of the etch films to the substrate and the etching of multiple stacked films.

These features provide a high etch rate with high resist survival through the use of a refrigerated liquid cooling on the top and bottom electrodes, thus allowing high power with good photoresist preservation during the operation.

These and other advantages and features of the invention will be more apparent from reading of the specification in conjunction with the figures in which:

BRIEF DESCRIPTION OF THE FIGURES

FIGS. 23 and 24 illustrate the electrical assembly;

DESCRIPTION OF THE PREFERRED EMBODIMENTS

Figure 1:
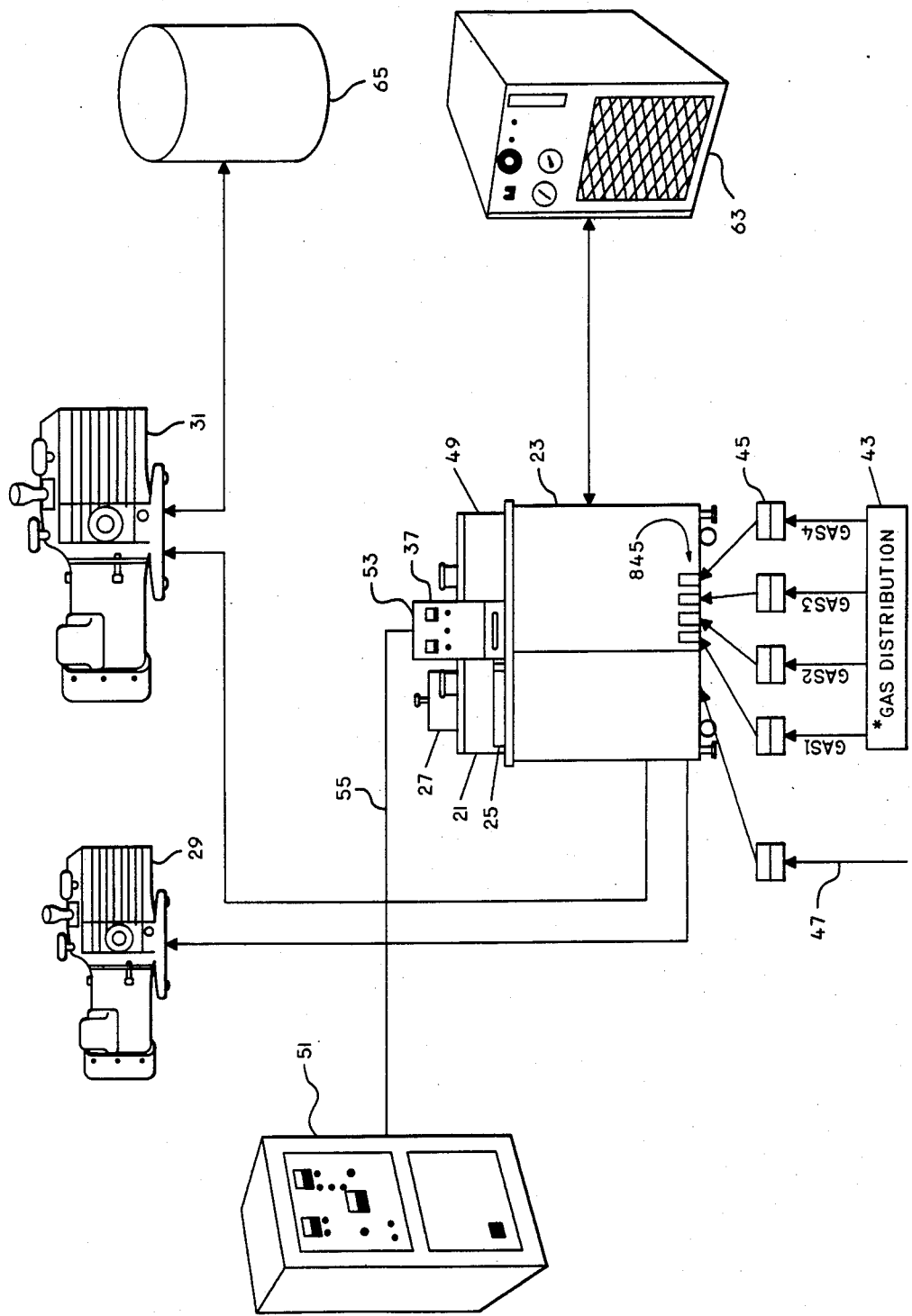
FIG. 1 is a front elevation of a cassette load lock plasma reactor according to the invention.
Figure 2:
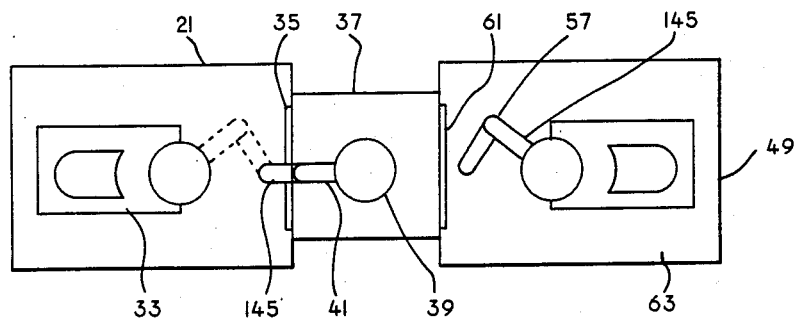
FIG. 2 is top view of the cassette load lock plasma reactor according to the invention.

In FIG. 1 there is shown a front elevation of a cassette load lock plasma reactor. The cassette of semiconductor wafers having photoresist patterns printed on them is placed in an entry load lock 21. A process is entered into a microprocessor that is contained within the cassette load lock reactor 23 by a keyboard 25 and a display 27. The menu is loaded in memory of the microprocessor and the process sequence begins. The entry load lock 21 is pumped down to a predetermined pressure or process pressure by a vacuum pump 29. The process pressure is maintained by feedback control circuit via a manometer that provides information to the microprocessor within the cassette load lock reactor 23 to control a throttle valve that is used to control the pump rate of the entry load lock 21. At the time that the entry load lock 21 is being pumped down to a process pressure and maintained there, the main chamber is either pumped down to main process pressure or is maintained at process pressure by a main chamber pump 31. A cassette elevator that is contained within the entry load lock 21 positions a first semiconductor wafer or slice that is to be processed by the cassette load lock reactor 23 and in the embodiment shown in FIG. 1, a cassette that is a handling device that stores a plurality or in the case of FIG. 1, 25 semiconductor wafers. Each wafer has patterns for semiconductor circuits printed on them by a photoresist process. The first semiconductor wafer is, as shown in FIG. 2, positioned by the cassette elevators located generally at 33. The semiconductor wafer by an articulating arm 41 is moved from the entry chamber 21 through an isolation gate valve 35 into a main process chamber 37 and placed on the main chamber bottom electrode 39 for etching. The position of the semiconductor wafer 143 is controlled by a feedback system and capacitive sensors that monitor the movement of the semiconductor wafer from the load lock chamber into the main chamber. After the slice is sensed to be safe in the main chamber 37 and the articulating arm 41 is sensed to be moved back into the entry load lock 21, the isolation gate 35 is closed and appropriate gases are applied from the gas distribution system 43 of FIG. 1 through the filtering systems generally at 45 and applied to the main chamber 37 by flow controllers 845 that are contained within each gas line 45. In the embodiment of FIG. 1, up to four gases may be applied to the main chamber for the process. Additionally, in FIG. 1, a nitrogen line 47 provides nitrogen gas for purging of the system when it is necessary to open up the main chamber, the entry load lock or the exit load lock 49.

As prescribed by the menu that was entered on the keyboard 25, pressure established by a throttle valve that is connected to the main chamber vacuum pump 31 and a manometer pressure sensor and the feedback loop process control is maintained by the microprocessor within the cassette load lock reactor 23. The cassette load lock reactor 23, in the embodiment of FIG. 1, is a plasma reactor and a plasma is formed by applying RF energy between the two electrodes that are contained within the main chamber 37 which ionizes the gases to form reactant gases that include ions, free electrons and molecular fragments. The gases are provided by the gas distribution 43 and the filters 45. RF power is provided to the main chamber 37 by an RF generator 51 and is applied to an RF matching network 53 by a conductor 55. The RF matching network controls and adjusts the energy that is applied between the electrodes that are contained within the main chamber by sensing the reflected power and converting this information to the digital signal that the microprocessor within the cassette load lock 23 will respond to.

In either etching or deposition process, the processing is automatically terminated by the microprocessor within the cassette load lock reactor 23. When in the etching mode, an endpoint is detected by an endpoint detector in the cassette load lock 23 which measures change in the optical emissions at a specific wavelength. The cassette load lock reactor 23 that is shown in FIG. 1 and 2 provide multiple menus to be run on the same slice by the proper selection during the menu entry to the keyboard 25. After the process is complete, the slices or semiconductor wafers are automatically removed from the main chamber by a second articulated arm 57 that is located within the exit load lock 49 and is passed through a second isolation gate 61 and placed in an empty cassette whose position is positioned by the elevators at 63. At the completion of the processing of each semiconductor wafer, the process is repeated until all of the semiconductor wafers have been processed by the cassette load lock reactor after which the entry load lock 21 and the exit load lock 49 are brought up to atmospheric pressure by applying nitrogen through line 47 to purge the entry 21 or the exit load lock 49. The cassette is then removed and a new cassette is loaded for processing.

Heat transfer from the slice during etching is accomplished through a refrigerated system that is contained within a refrigerator controller 63 that refrigerates in the embodiment of FIG. 1, an ethylene glycol - water mixture flowing through the top and bottom electrodes that are contained within the main chamber 37. A thermocouple sensor element is used to monitor the temperature so that the process may be controlled by the microprocessor that is contained within the cassette load lock reactor 23. Additionally, the oil that is used by the main chamber vacuum pump is re-circulated and filtered by a filter system 65.

Figure 3:
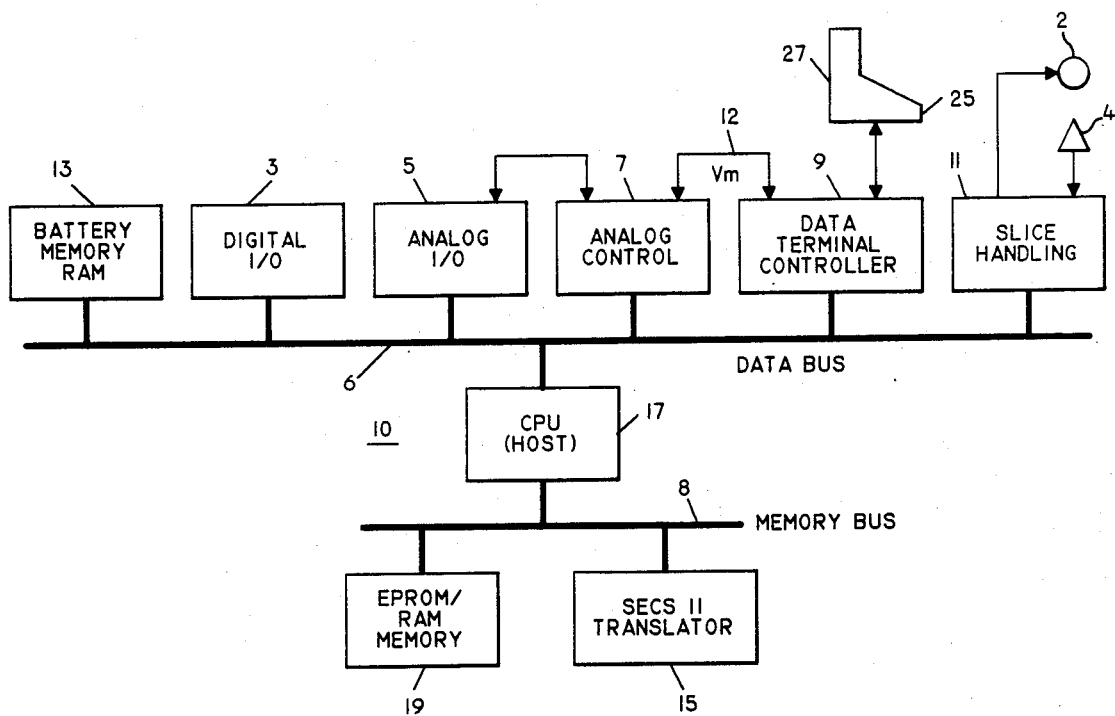
FIG. 3 is a blcok diagram of the control system for the plasma reactor according to the invetinon.

FIG. 3 is a block diagram of a microprocessor control system 10 that is used to control the operation of the cassette load lock reactor 23. In particular, a central processing unit 17, which in the embodiment of FIG. 1 is manufactured with a 9900 microprocessor that is manufactured by Texas instruments incorporated of Dallas, Tex. or can be any central processing unit known in the art that has similar specifications as to speed, word length and operation.

The central processing unit 17 has an EPROM and RAM memory 19 which stores data and program instructions that are used to control the I/O devices that are connected to data bus 6. A language translator 15 is provided which is used to convert SECS II protocall into internal protocall that the CPU 17 will recognize. SECS II is an industry standardized interface for semiconductor equipment communication.

The central processing unit or CPU 17 is connected to a data bus 6, which interfaces to the I/O devices. In particular, a battery memory RAM 13 stores menu data that is provided to the processor system 10 of FIG. 3 by the keyboard 25 and the display terminal 27. A digital I/O 3 provides digital controls to control the process to include the gate valves and other controllable devices that are contained within the cassette load lock reactor 23 or the power load lock reactor 523 of FIG. 26 and receives status from these devices indicating the initiation of operation or the completion of operation. The status and control signals that are used to control the operation of the devices of FIGS. 1 or are listed in Table 1.

TABLE I

Inputs (Status) and Outputs (controls) of the Digital I/O.

Device Status Controls

Gate valve 35 opened/closed open/close
Gate valve 61 opened/closed open/close
Valves 704 opened/closed open/close
Valves 705 open/closed
Valves 706 opened/closed open/closed
Valves 707 open/closed
Valves 708 opened/closed open/closed
Valves 709 open/closed
Valves 771 open/closed
Valves 773 open/closed
Valves 774 open/closed Purge on/off
Chamber gass on/off
RF on/off on/off
Gas valves 710
through 719 on/off
Elevator position #1 through 4
Lid interlock on/off
Chamber pressure
interlock on/off An analog I/O device 5 provides analog control signals on its output by converting digital commands that are provided to it to analog signals by digital to analog converters. It additionally receives analog signals back from the cassette load lock plasma reactor 23 and the power load lock reactor 28.

Table 2 provides a listing of the signals that are converted to either analog signals from digital commands provided to the analog I/O device 5 by the microprocessor 17 or analog signals received by the analog I/O device and converted to digital signals by the D to A's that are contained within the analog device 5.

TABLE II

Analog commands and inputs for the analog device 5
Inputs analog to digital converters:
1. Manometers 752 and 770 for cassette load lock, 752, 772 and 775 for power load lock for monitoring pressure.
2. Mass flow control devices 721 through 724 for cassette load lock plasma reactors and 721 through 730 for power load lock reactors
3. RF power control
4. Endpoint detection 50,52
5. Temperature
Commands digital to analog converters
1. Pump rate (throttle valves 704, 706 and 708) for maintaining pressure
2. Flow rate set mass flow valves 721 through 724 for the cassette load lock plasma reactor and 721 through 730 for the powered load lock reactor
3. RF power set
4. Endpoint detection automatic gain control 50, 52
5. Temperature It should be noted that the analog I/O is just a parallel combination of digital to analog converters or analog to digital converters that are connected to the data bus 6 and the digital I/O 3 is a plurality of line drivers and receivers. Control is provided by the analog controller 7 which is a microprocessor such as a Texas Instruments 9900 that is programmed according to the microcodes that are contained within Table 3. Any microprocessor that is capable of meeting similar specifications may be used however, in lieu of the Texas Instruments 9900.

The data terminal is controlled by data terminal controller 9 which interfaces the display 27 and the keyboard 25 to the microprocessor 17 as well as displaying the voltage representation that is provided from the RF generator 51 and the analog control unit 7 by a data line 12. Table 4 provides the microcode for the data terminal controller 9. The movement of the semiconductor wafers from each cassette into the reactor chambers and from the reactor chambers into the exit chamber is controlled by a slice handler 11 through the operation of stepper motors 2 and in response to sensors 4. The slice handler 11 is a microprocessor which provides digital commands on its output and receives digital inputs from the sensors. The microprocessor is a device, again, such as the TI9900 and the microcode for which is provided in Table 5A is used by the cassette load lock reactor 23 and Table 5B is used by the slice handler, in the power load lock reactor 523. The program that is used to control the central processor unit 17 is a complex program and in the embodiment of FIG. 3 has a pascal compiler. A pascal listing of the programs that are stored within the CPU 17 is provided in Table 6 for the powered load lock reactor of FIG. 26 and Table 7 for the cassette load lock reactor of FIG. 2. Tables 3–8 are provided in U.S. Pat. application U.S. patent application No. 603,901;. Table 8 is an assembly language for subroutines used by the CPU 17 and stored in EPROM 19 U.S. patent application Ser. No. 663,901; is incorporated herein by reference.

Figure 4:
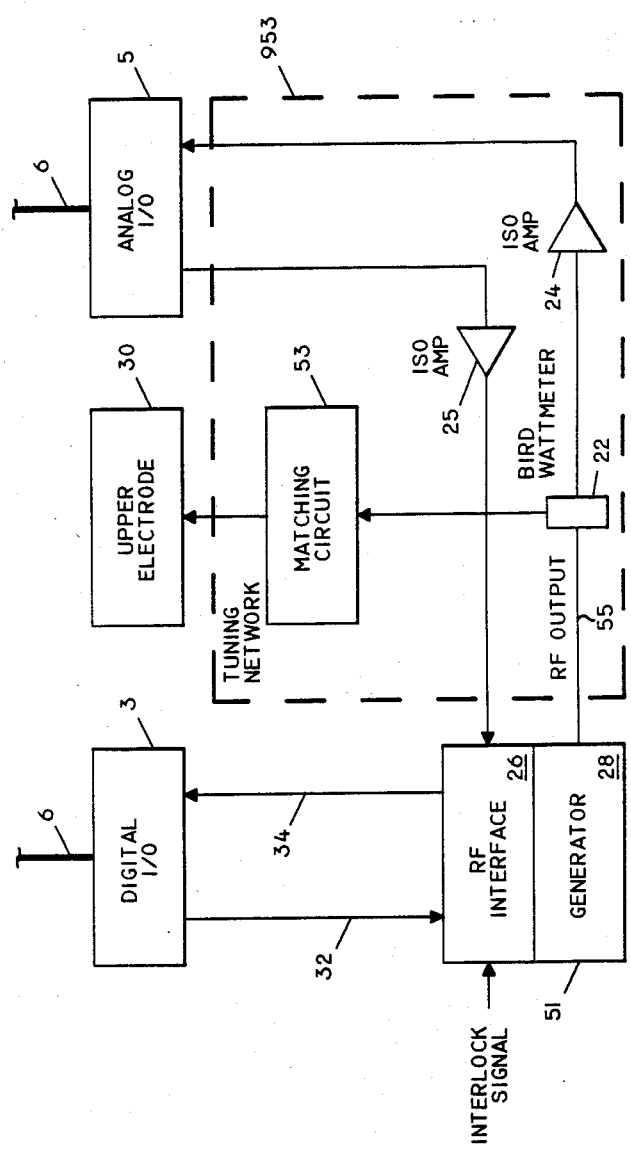
FIG. 4 is a block diagram for the RF circuit.

FIG. 4 to which reference should now be made, there is shown a block diagram of the control circuit that is used to control the radio frequency energy that is applied to the load lock reactors 23 and 523. As was indicated in conjunction with FIGS. 1 and 3, the microprocessor 17 provides an output command to the RF generator 51 by a control line 32. The RF generator 51 includes an RF interface 26 and a generator 28. This is a commercially available unit as manufactured by Plasma Therm Inc. or can be a device such as that manufactured by Ortec Incorporated of Oak Ridge, Tenn. Status of the operation is provided back to the digital I/O 3 by a data bus 34. The RF output is applied from the RF generator 51 and in particular, the generator section 28 of the RF generator 51 to the matching network 53 by a conductor 55. The matching network includes a Bird Watt meter 22, manufactured by Bird Electronics of Columbus, Ohio, which monitors power that is applied to the upper electrode 30 that is contained within the main chamber 37 by an impedance matching circuit 53. The output of the Bird watt meter 22 is applied by an isolation amplifier to the analog to digital converter as contained within the analog I/O 5 and to the analog control microprocessor 7. Adjustment of the RF energy that is applied to the cassette load lock reactor 23 and power load lock reactor 523 is provided by the microprocessor 17 of FIG. 3. A digital to analog converter that is a part of the analog I/O 5, an isolation amplifier 25 in the RF interface 26 will cause the RF generator 51 to adjust its energy in response to the analog signal that is applied to it. This of course, provides a feedback loop for the host microprocessor 17 to control the plasma operation according to the prescribed menu that is entered by the keyboard 25.

Figure 5:
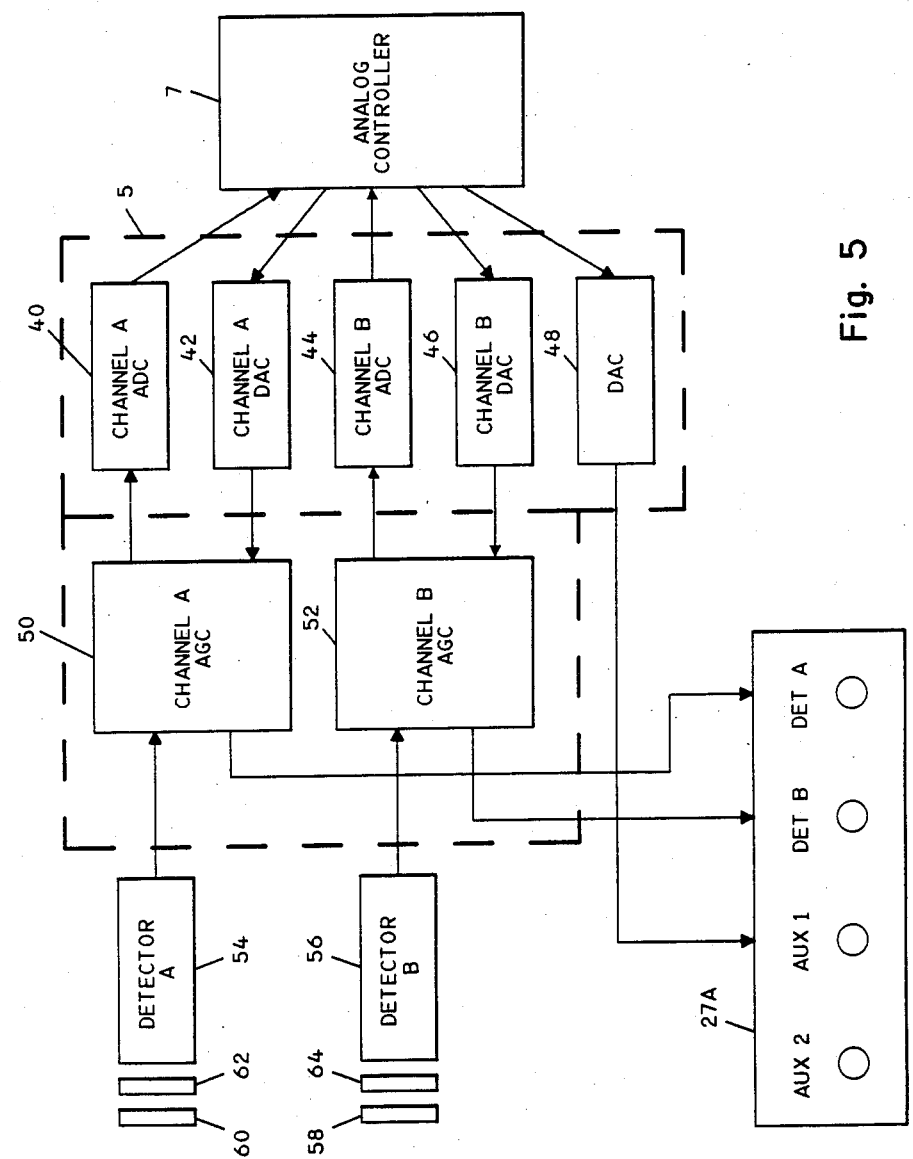
FIG. 5 is a block diagram for the endpoint detection logic.

FIG. 5 is a block diagram of the control system that is used to detect the endpoint of the operation. In the embodiment shown in FIG. 5, there are dual channels used in the endpoint detection process. Quartz windows 58 and 60 provide and optical opening into the main chamber 37. Adjustable filters 62 and 64 can be selected to ensure that only light having the proper wavelength is applied to the endpoint detector 70. There is, as described earlier, two channels, an A channel and a B channel. The A channel has a light detector 54 which is a device such as a photo multiplier or silicon detector. The B channel detector 56 of course is a similar device.

Each channel has an automatic gain control circuit 50 and 52. The gain of the automatic gain control circuits 50 and 52 is controlled by the analog controller 7 and the analog I/O 5. In particular, the output of the automatic gain control circuit 50 for channel A is applied to an analog to digital converter 40 that is contained within the analog I/O 5 and applied to the analog controller 7 where the data is processed and passed on the host microprocessor 17. Adjustment of the automatic gain control circuit 50 is provided by either the host microprocessor 17 and/or the analog controller 7 by providing a digital command to a digital to analog converter 42 that is contained within the analog 5. The digital to analog converter 42 provides an analog signal to adjust the gain on the automatic gain control circuit 50. The output of the channel B automatic gain control circuit 52 is converted to a digital signal by an analog to digital converter 44 that is contained within the analog I/O 5 and is processed by the analog controller 7 for averaging of data to be used by the central processor 17. An output to set the automatic gain control circuit 52 is provided by a digital command being provided by the analog controller 7 whether originated from the analog controller 7 or the CPU 17 and is converted to an analog signal by the digital to analog converter 46 and applied to set the automatic gain control of the channel B automatic gain control circuit 52. Additionally, the display at 27a provides display of the setting up of the automatic gain control 50 and 52. An auxiliary display is provided from the analog controller 7 and a digital to analog converter 48. These provide meter displays of the endpoint detector circuit.

The operation of the endpoint detector allows the user through the keyboard entry 25 to define parameters which can be defined as two classes, the detection mode and the detection parameters.

Figure 6:
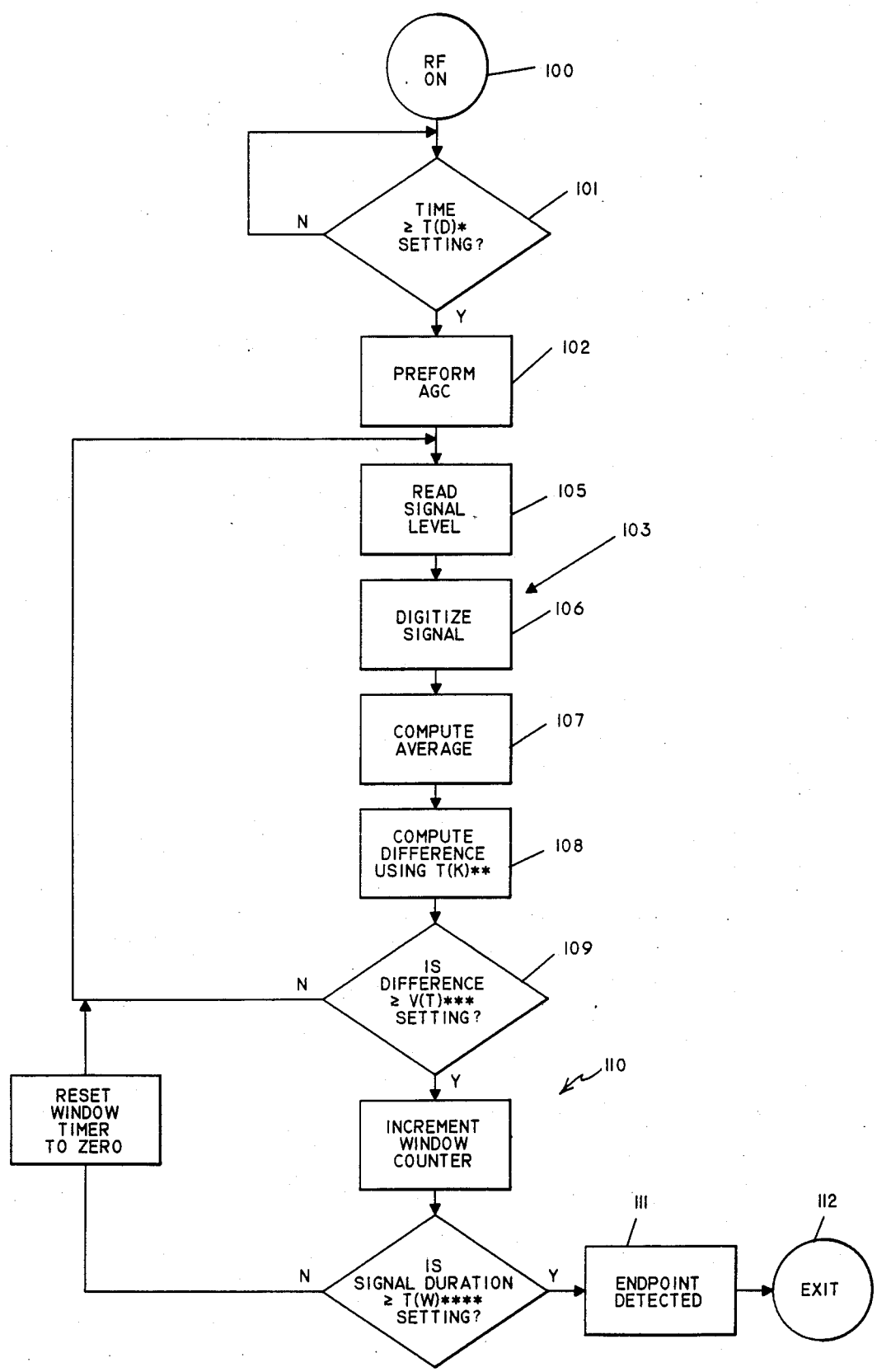
FIG. 6 is a flow diagram of the endpoint detection process.

The detection mode parameter is selected by the users and provide the following mode of operation. No endpoint mode is when the endpoint detector does not operate. Either channel A or channel B detector outputs can be monitored and applied to a strip chart recorder via the display outputs 27a. Channel A endpoint selects a signal from channel A detector to be used to determine the endpoint. The channel B mode selects the signal to be used as the endpoint detection from channel B. The a-b endpoint detection subtracts the output of B from channel A. In this mode, the signal used for endpoint detection is formed by subtracting the detector B signal 56 from that of the A detector 54. The purpose of this mode is to allow the signal to noise ratio of the combined signals to be increased by removing correlated noise during the subtraction process. The final mode of operation is the amode in which the detector outputs from channel B are added to the detector outputs from channel A. This mode is useful to increase the available amount of total signals for the detection process. FIG. 6 provides a flow diagram of the adjusting of the automatic gain control circuits 50 and 52 and the operation of the endpoint detector circuit as is programmed by the analog controller 7. The endpoint detector of FIG. 5 is designed to detect the endpoint when the following parameters are set. The window lenght, T(w) is the time interval during which endpoint signal after signal process must remain greater than its selected threshold value for the endpoint to be determined. The filter factor T(k) determines the time interval used to perform the digital differentiation of the endpoint signal by the microprocessor 7. The +/− threshold V(t) is the percent of voltage of an upper limit, such as eight volts in the embodiment of FIG. 5 and is said to correspond to either positive or negative slope endpoint signal. This threshold is selected as a percent of the maximum voltage. The delay to detector time T(d) is in units of seconds as the time interval from the application of RF energy to the main chamber 37 to the start of endpoint detection. For example, entering of a number 40 to the keyboard 25 means that the endpoint detector will not start looking for the endpoint until after 40 seconds has expired after the RF energy is applied to the main chamber 37 by the RF generator 55. FIG. 6 is a low diagram of the process in which the microprocessor 7 is used to perform all the signal processing for the endpoint detectors. After the initialization of turning on RF energy at circle 100, the unit waits for the delay to detect time to expire at diamond 101. The adjustments of the AGC units 50 and 52 is performed at block 102 and in the embodiment of FIG. 5, the AGC is adjusted to provide an output of five volts. The AGC is then sampled and in the embodiment of FIG. 5, the sample rate is every one-tenth second. This is illustrated by the control loop at 103 and includes the steps of reading the signal level block 105, converting the signal level to a digital signal by the analog digital controller of either 40 or 44 at block 106 computing the average signal over a period of time over block 107, computing the difference using the filter factor at block 108 and comparing to see if the difference or summation i.e. a−b, a+b or either a or b is greater than or equal the threshold voltage at block 109. This loop continues until the difference including at block 109 is greater than or equal to the voltage threshold in which case the rendered length is incremented to insure that the window length has expired as indicated in by control loop 110. If the window length has expired, then an endpoint detection is indicated at block 111 and the operation is complete and exited from at circle 112. It should be noted that in performance of the AGC operation, the analog controller 7 reads a data word, interprets it as a voltage, compares it to a reference such as 5 volts. It then computes a gain adjustment word and sends it to the digital to analog converter either 42 or 46 which converts a digital word into a voltage level. This voltage is applied to the automatic gain control circuit either channel A AGC 50 or channel B AGC 52, of the circuit which act as of course a multiplier. In this matter, the gain is adjusting using a successive approximation until the output of either or both the channel A AGC 50 or the channel B AGC 52 is at a predetermined voltage level which in the embodiment of 55 is five volts.

Figure 7A:
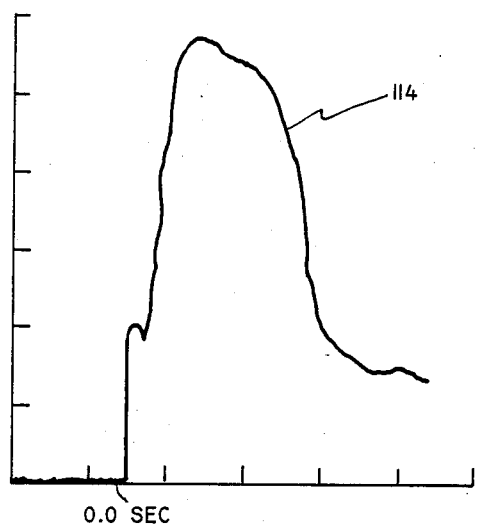
FIGS. 7A and 7B are waveforms illustrating the detection of an endpoint.
Figure 7B:
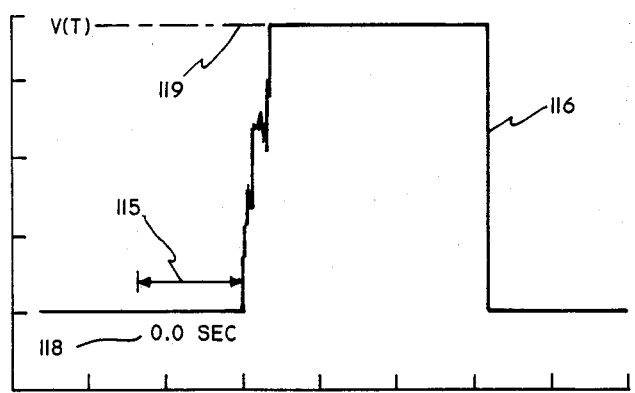

FIG. 7 illustrates the operation of the control loop of FIG. 6 graphically. In particular, FIG. 7a is a curve that illustrates the signal level output from either the A detector 54 or the B detector 52 by waveform 114. In FIG. 7b, waveform 116 illustrates the output from the analog controller 7 as is displayed on the auxiliary 1 output of the display 27a in which at point 118 the RF powerr is turned on. The window T(w) is represented by dimension lines 115. At point 119, the threshold voltage V(t) is exceeded and the endpoint is detected. When an endpoint is detected, a square wave output as illustrated by waveform 116 is produced.

GAS AND VACUUM CONTROL SYSTEM

Figure 8:
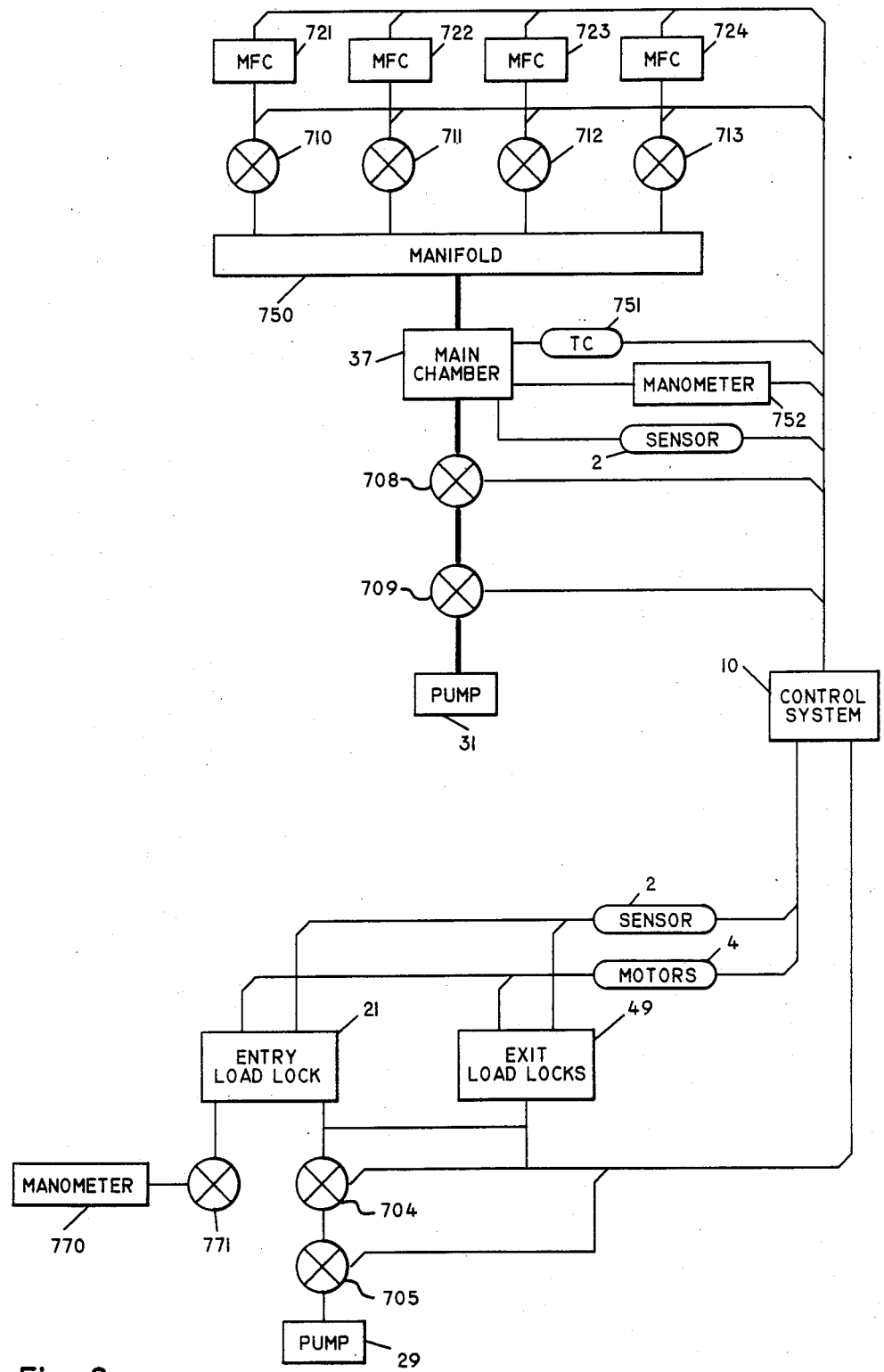
FIGS. 8 and 9 are the gas and vacuum flow diagrams.

The vacuum and gas control system for the cassette load lock plasma reactor 23 is illustrated in FIG. 8 to which reference should now be made. The gas from the gas distribution 43 of FIG. 1 is applied to a manifold 750 by a mass flow controller 721 through 724. The mass flow controllers are controlled by the analog inputs from the control system 10 and additionally valves 710 through 713 are controlled by the status I/O 3 of the control system 10 and are on/off valves. The gases mixed in the manifold 750 and applied to the main chamber 37 where the temperature of the reaction within the main chamber is monitored by a thermocouple 751. The thermocouple 751 is an analog input to the analog I/O 5 of the control system 10. A vacuum pump 31 pulls a vacuum in the main chamber 37 when the block valve 709 is open. The flow rate is controlled by a throttle valve 708 which position is fed into the analog input and is set by the output from the analog input of the control system 10. Sensors 2 senses the position of the silicon wafer within the main chamber 37. The vacuum of the entry load lock 21 and the exit load lock 49 is provided by pump 29 as was discussed in conjunction with FIG. 1. Gate valves 705 and 707 are set open and the pump rates are controlled by throttle valves 704 and 706. The gate valves are interfaced in the control system 10 at the digital I/O 3 and the throttle valves 704 and 706 are controlled by the analog I/O card 5. Additionally, the positioning of the semiconductor wafers within the entry load lock 21 and the exit load lock 49 is provided by the sensors 2 and motors 4.

Figure 9:
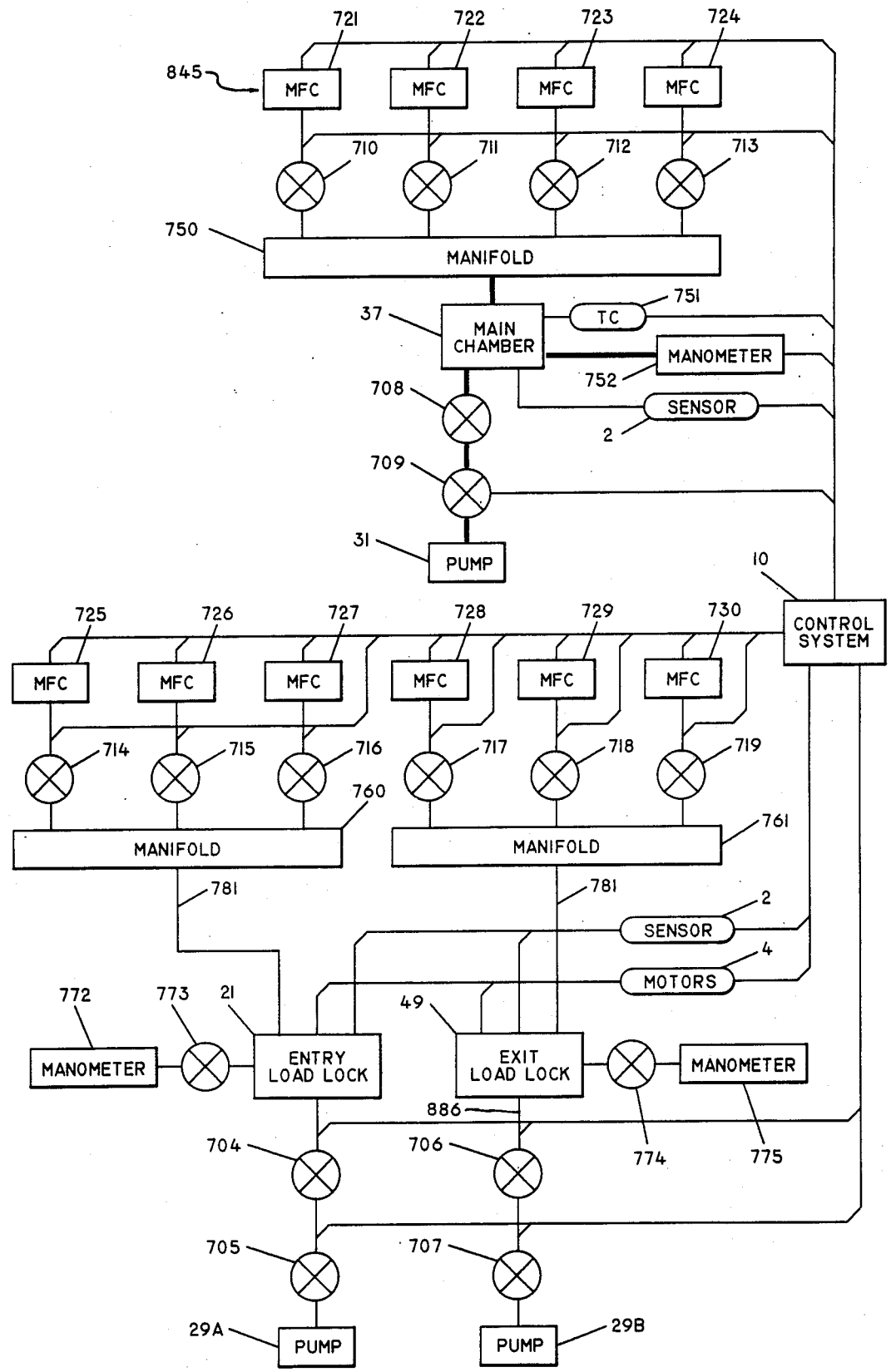

FIG. 9 to which reference should now be made is shown the gas and vacuum flow diagram for the power load lock 523. The difference in the powered load lock 523 and the cassette load lock 23 is due to the fact that the entry load lock can have a plasma reaction as well as the exit load lock 49. In this case there are 2 vacuum pumps required, 29a and 29b. The entry load lock has a gas manifold 760 which mixes three gases from three mass flow control valves 725 through 727 which are controlled by the analog inputs and outputs from the control system 10 and are activated by setting of gate valves 714, 715, 716. The exit load lock 49 can have a plasma reaction based upon the mixture of up to three gases in a manifold 761 that are controlled by mass control valve 728, 729 and 730. The on/off operation of the gas flow into the manifold 761 is provided by the digital I/O 3 of the control system and controls the valves 717, 718, 719 as is the case with the gas valves into the entry load lock 21.

Figure 10:
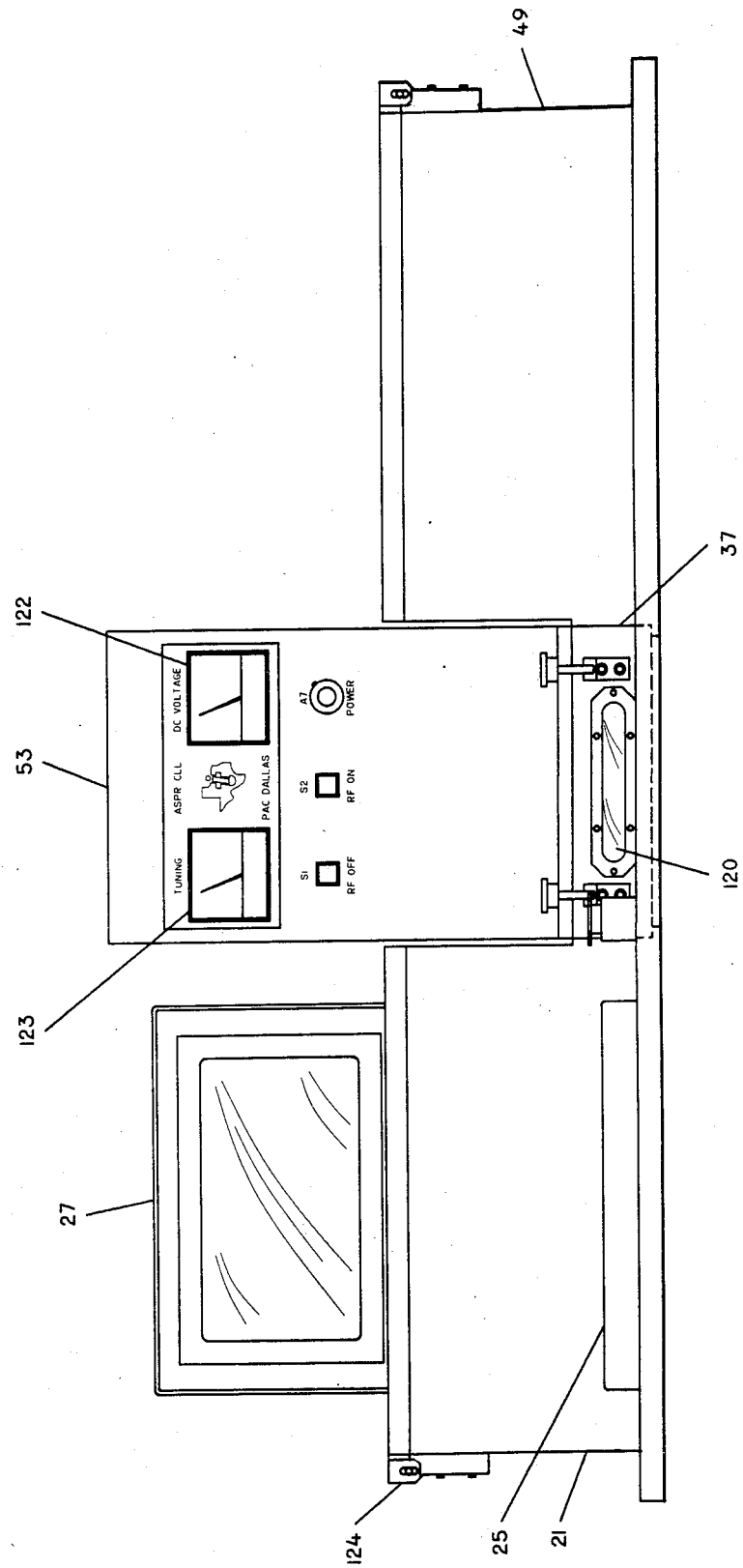
FIGS. 10 and 11 are different views of the cassette load lock plasma reactor.

In FIG. 10, cassette load lock reactor to which reference should now be made, there is shown a front view of the cassette load lock reactor 23 in which the keyboard 25 provides, as discussed earlier, a data entry point that is the information of which is displayed on a display 27. The distinguishing features of FIG. 10 also illustrate a quartz window covered with plexiglass or other plastic 120 for viewing by the operator of the plasma reaction that is going on within the main chamber 37. This also enables the operator to insure that the semiconductor wafer is in the proper position between the electrodes during the reaction process. Additionally, the tuning of the RF generator 51 is illustrated by tuning meter 123 and the DC voltage that develops across electrodes is displayed by the DC voltage meter 122. This of course, in FIG. 3 is provided by the analog control 7 to the terminal controller 9 via data line 12.

Figure 11:
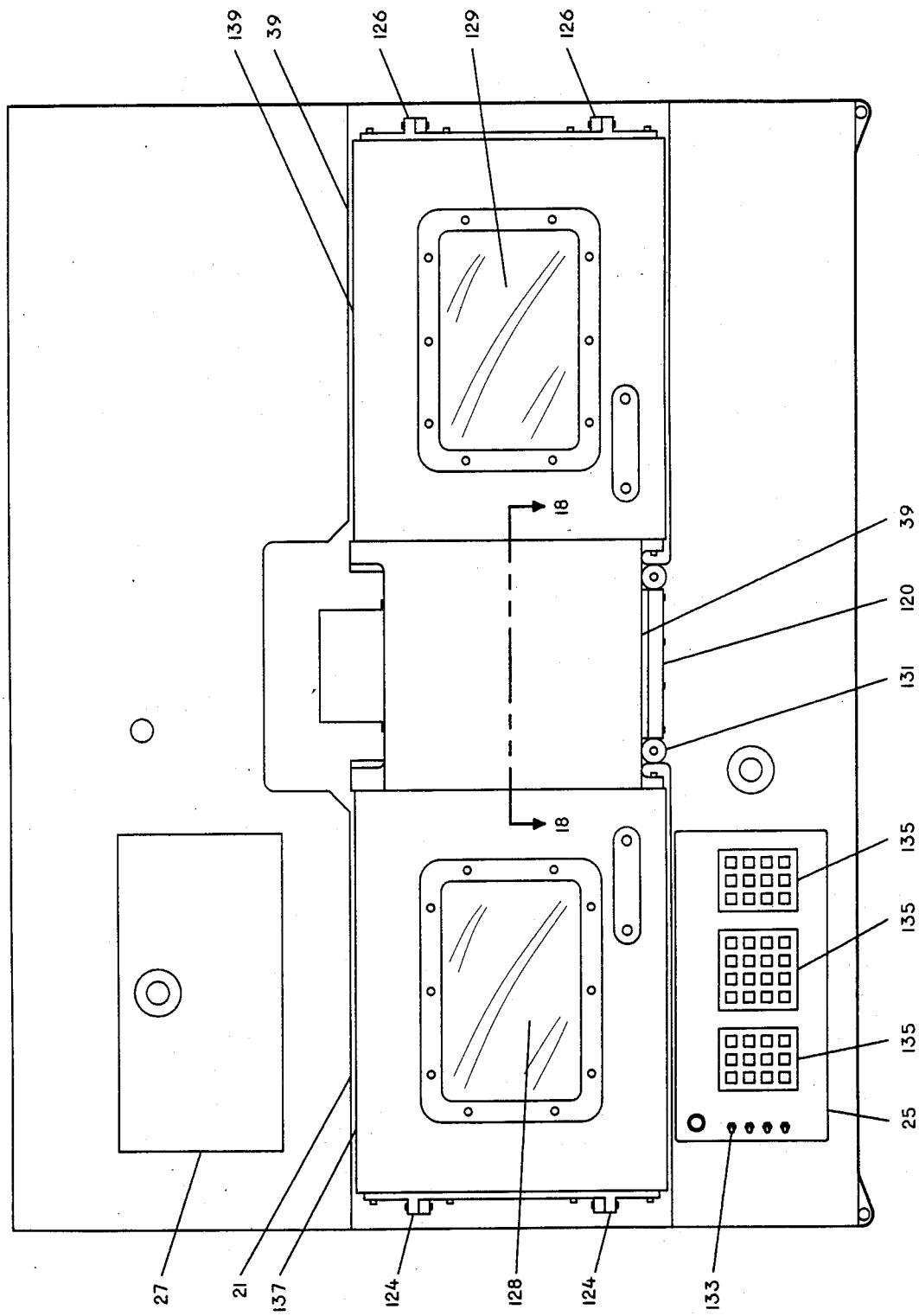

FIG. 11 is a top view of the cassette lock load plasma reactor 23 in which the keyboard 25 is illustrated showing switches 133, and keypads 135. The cassette that contains the semiconductor wafers to be processed is placed within the entrance load lock 21 by lifting a vacuum tight lid 137 and rotating it around hinges 124 to place the cassette into the entrance chamber 21. Glass window 128 provides for visual inspection of the placement and the transfer of the semiconductor wafers from the entrance load lock 21 to the main chamber 39. Similarly, at the completion of the process of a cassette of semiconductor wafers, the lid 139 of the exit load lock 39 is lifted by rotating the lid 139 around the hinges 126 by removal of a cassette of processed semiconductor wafers.

SEMICONDUCTOR WAFER HANDLING INCLUDING TRANSPORT ARM

Figure 12:
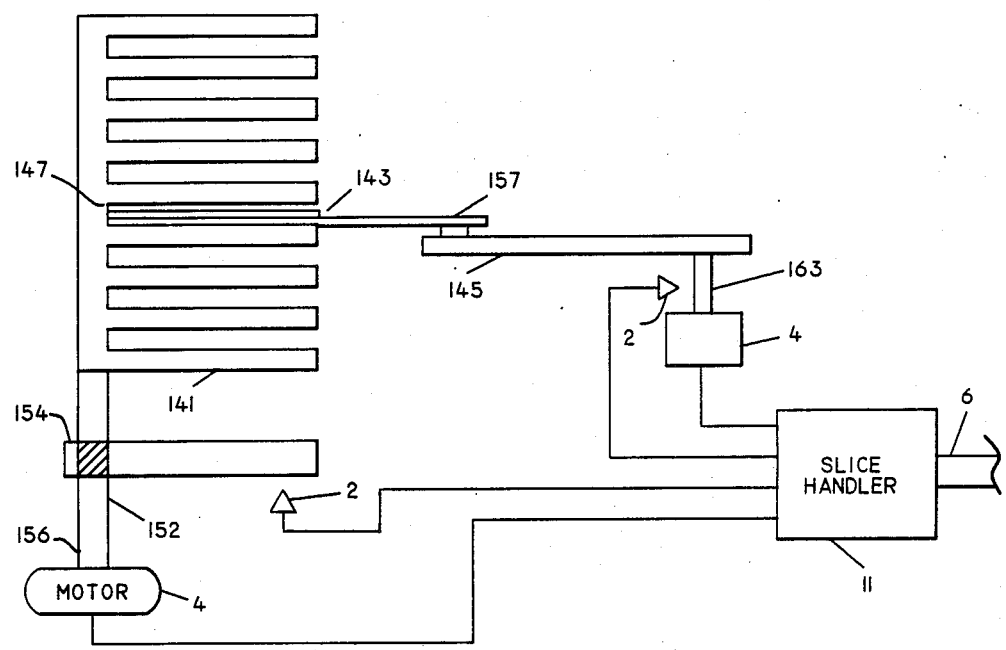
FIGS. 12 through 13 illustrate the wafer transport system.
Figure 13:
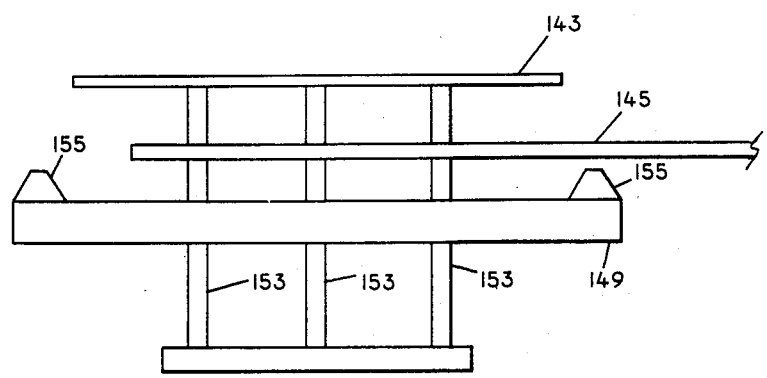
Figure 14:
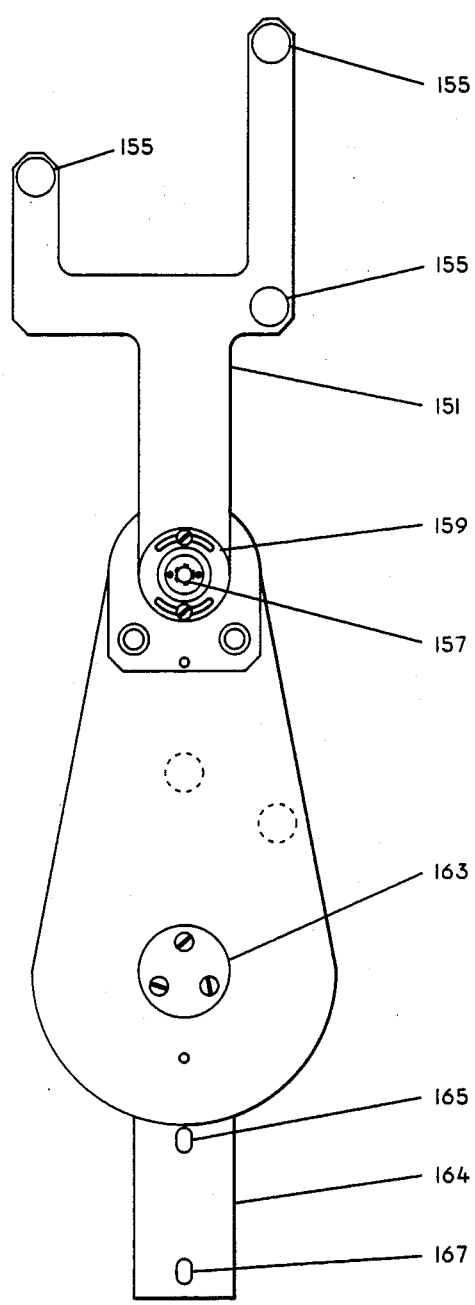
FIGS. 14 through 17 are drawings illustrating the slice transport arm.
Figure 15:
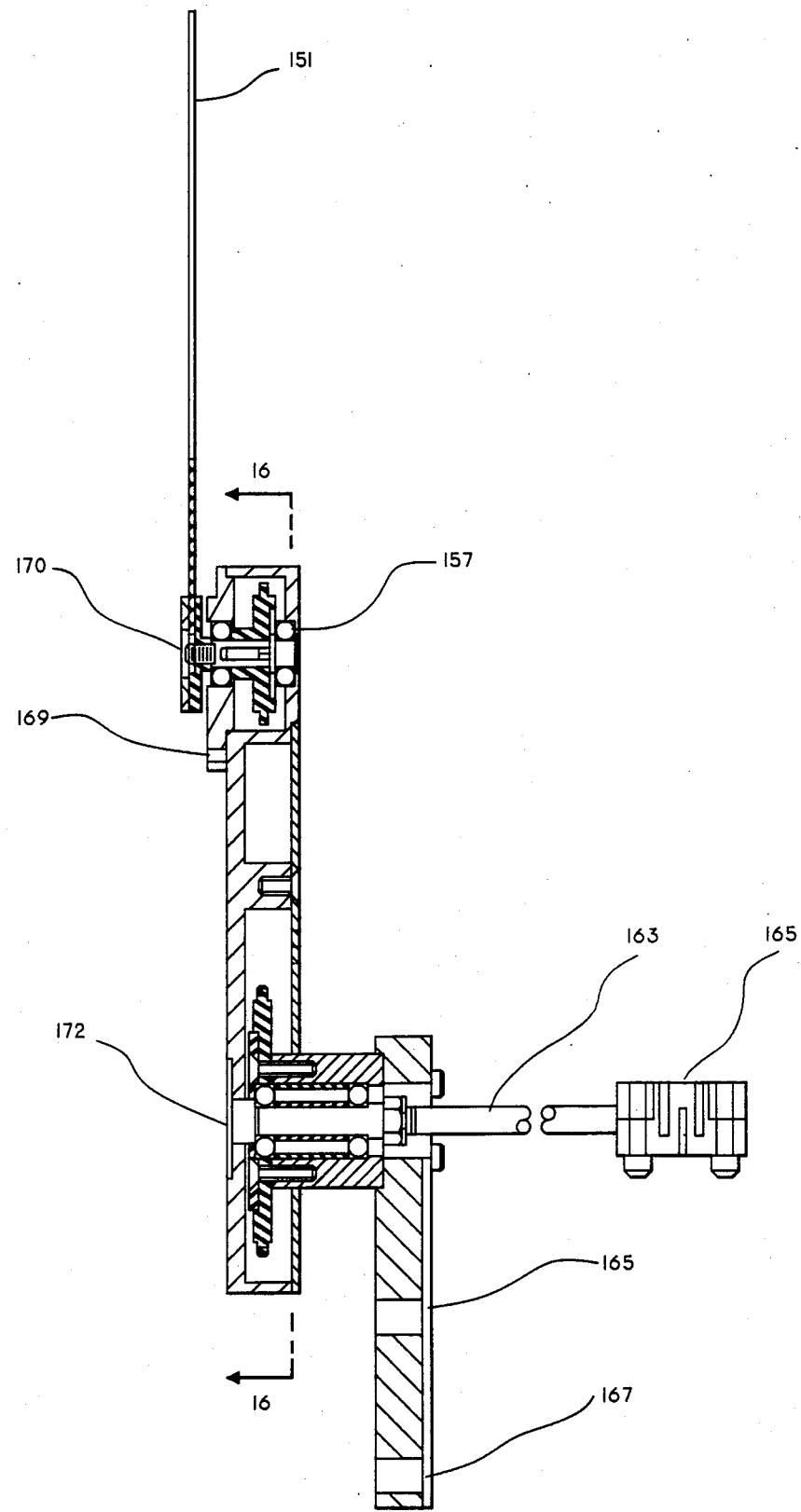
Figure 16:
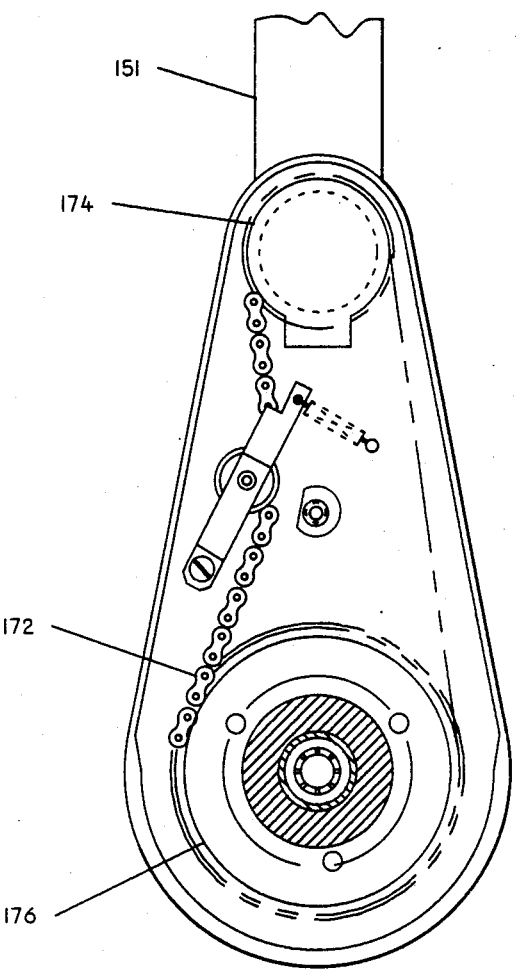
Figure 17:
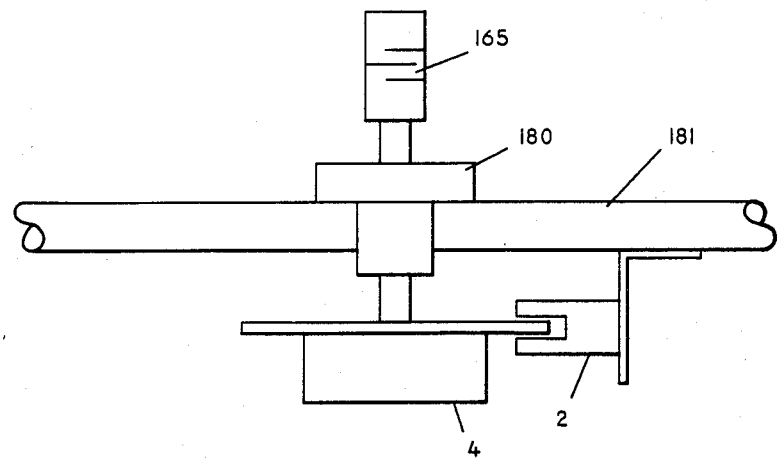

FIG. 12, to which reference should now be made, there is shown a cassette 141 containing a plurality of semiconductor wafers or slices 143. A slice transport arm 145 is placed into the cassette 141 and the cassette 141 is lowered by an elevator 156 that includes lead screw 152, stepping motor 4, and sensor 2, until the semiconductor wafers 143 rest on the slice transport arm 145 in the middle of the slice opening 147. Because the slice is not touching any part of the cassette as it leaves during the rotation of the slice transport arm, there is no friction between the semiconductor wafer 143 and the slice handling arm 145. This feature minimizes particular generation as the slice leaves the cassette 141. The position of the slice transport arm 145, the cassette 141 are controlled by the slice handler 11 of FIG. 3 and the motors 4 and sensors 2. The cassette platform 154 provides a reference position for the cassette 141 and thus the exit position of the cassette can be determined with the sensor 2 and precise control of the elevator 156. After the semiconductor wafers leaves the input cassette 141, it may be placed over a primary staging platform 149 or on the reactor substrate as is illustrated in FIG. 13. The semiconductor wafer 143 is lowered to the staging platform 149 by a lifting assemblies 151 which provide a plurality of lift pins 153 that lifts the semiconductor wafer 143 off of the slice transport arm 145. The unloaded arm is then removed from under the semiconductor wafer 143. When the unloaded slice transfer arm 145 is clear, the semiconductor wafer 143 is lowered onto the staging platform 149 which centers the semiconductor wafer 143 through the action of the centering pins 155. When the entrance slice handling arm 145 is moved under the platform 149 and the slice after being raised by the pin assembly 151 and the pins 153 are retracted the semiconductor wafer is lowered onto the slice transport arm 145. When the main chamber 37 is ready to accept a semiconductor wafer 143, the entrance load lock slice transport arm 145 moves into the main process chamber 37 through the gate valve 35. (FIG. 2) The semiconductor wafer 143 is then lifted off the slice transport arm 145 and the slice transport arm is then removed from the main process chamber. The semiconductor 143 is then lowered onto the substrate within the main process chamber for processing The semiconductor wafer 143 is removed from the main process chamber to the outlet chamber 49 by reversing the above discussed sequences and using the output chamber slice transport arm 147. FIGS. 14 through 17 illustrates the slice transport arm 145 as is used on the entrance chamber transport arm 41 or the exit chamber transport arm 57. A fork 151 is designed with touch pads 155 for balancing of the semiconductor wafers 143 thereon. The fork is rotatable around axis 157 which is adjustable through the setting of set screws 159. A main arm 161 rotates around axis 163 and is driven by a stepping motor to FIG. 17 which is coupled to the slice transport arm 145 via coupling means 165 and FIG. 15 feed through 180 which is a vacuum tight seal load lock walls 181. The wafer transport arms is mounted to the chamber by mounting bracket 164 and through holes 165 and 167. The arm assembly 161 contains a seal chain drive mechanism which is driven by a chain 172 of FIG. 16 which rotates causing sprocket 175 to rotate the fork 151 after being driven by sprocket 176 which is connected to the drive shaft 163 and coupling 165 of FIG. 15. As illustrated in FIG. 15, the slice transport arm is very narrow to facilitate it sliding under the semiconductor wafers 143 and entering the gate port between the load locks and reaction chamber.

Figure 18:
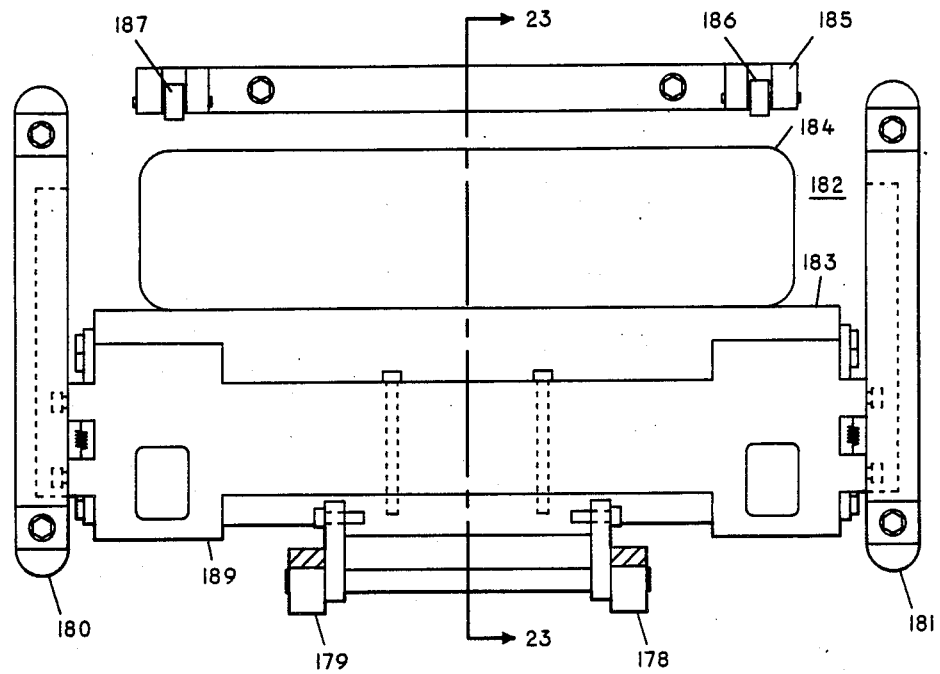
FIG. 18 is a view of the entrance port of the plasma reactor.
Figures 19, 20:
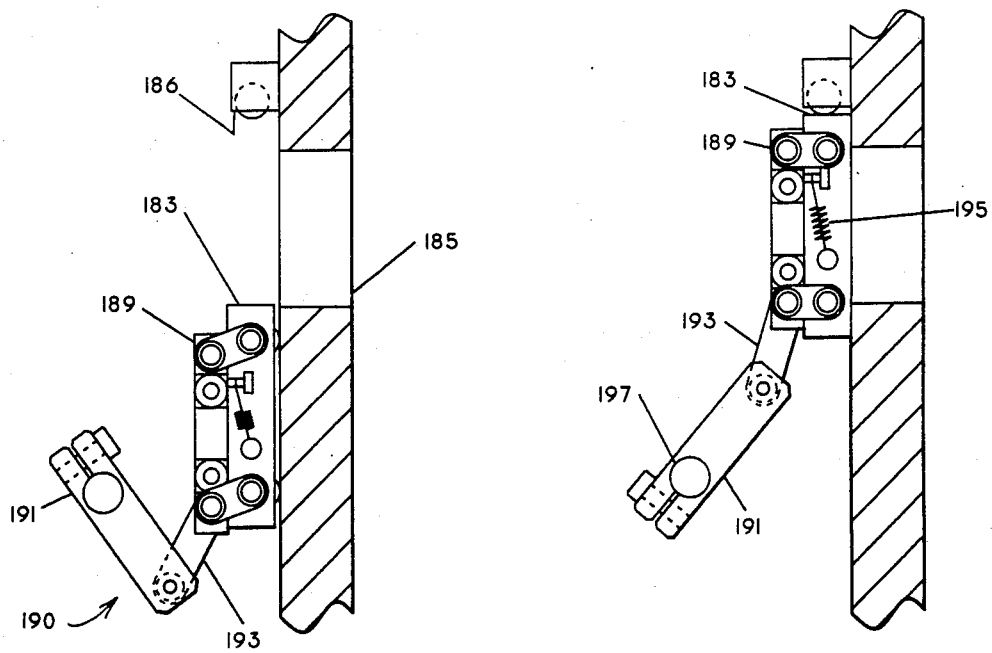
FIGS. 19 and 20 are views illustrating the operation of the gate valves.

GATE VALVES FIG. 18 is a side-view showing the entrance or the exit into the main chamber 37. A gate port 184 allows the slice transport arms 145 to transfer semiconductor wafers 143 into and out of the reaction chamber 37. A gate valve 35 or 61 which are identical device is shown in FIGS. 19 and 20 and include a gate plate 183 which presses against the sides 182 of the main chamber 37 to to provide a seal thereto. It is important to keep particulate emissions at a minimal and this is achieved through a camming action on gate valves. Guide rails 180 and 181 guide the gate valve 35 or 61 up to the gate plate 183 and comes in contact with stops 187 and 186. At this point, the camming action that is precipitated by the linkage 190 that includes a first arm 191 and second arm 193 going into place and locking as shown in FIG. 20 pressing the gate plate 183 against the gate stop 186 and 187 and transferring the gate carrier 189 into the up position. A spring bias provided by spring 195 holds the gate carrier 189 in the position shown in FIG. 19 until the bias provided by the spring 195 is overcome by the camming action through the rotation of the arms 191 and 193 via the rotation of a drive shaft 197 that is controlled by an air cylinder.

FIGS. 19 and 20 to which reference should now be made, illustrates a power load lock plasma reactor unit 522 in which a cassette 400 hundred contains a plurality of slices and is housed outside of the entry load lock 21. A process menu is entered into the microprocesor that is contained within the power load lock plasma reactor 523 and the process sequence begins. A single slice that is housed within the entry cassette 400 is moved from the entrance cassette 400 through the isolation gates 435 which are devices such as that disclosed in conjunction with FIGS. 19 and 20 and is carried to the power entry load lock with articulated arm 441. The power load lock 21 is pumped down to manometer to the microprocessor through a throttle pressure controller and the pre-etch process is begun within the entry load lock 21. The first semiconductor wafer is at the completion of the pre-etch process is moved from the entry load lock 21 through a second isolation gate 35 into the main chamber 37 and placed on a main chamber bottom electrode for etching. This is accomplished in the same manner as was discussed in conjunction with FIGS. 1-18. Feedback of the slice movement is accomplished by capacitive sensors in the load lock chambers and main chamber. After the semiconductor is sensed to be safe in the main chamber and the articulated arm is sensed to have been moved back from the main chamber into the entry load lock 21, the isolation are closed and the appropriate gases up to 4 are provided from the gas distribution 45. It should be noted that the gas distribution also provides gas to the entry load lock 21 up to 3 for the pre-etch reaction and to the exit load lock 37, additionally up to 3 gases may be applied there for post-etching and of course all of these are in addition to the purge gas which in the embodiments of these are in addition to the purge gas which is embodiments of FIGS. 1, 19 and 20 is nitrogen. As prescribed by the menu that has been entered by the keyboard 25, pressure stabilized by a throttle valve capacitor manometer feedback to the microprocessor, RF power is activated and applied from the RF generator 51 and automatically tuned by the RF matching network as was discussed in conjunction with FIG. 4, with control feedback from the reflected power to the microprocessor 7. Etching of the film is automatically terminated by the microprocessor 7 via the feedback from the endpoint detector as was discussed in conjunction with FIG. 6, seeing a major change in the optical emission at a given wavelength. Of course, multiple menus can be run on the same slice by the proper selection during menu entry.

Figure 21:
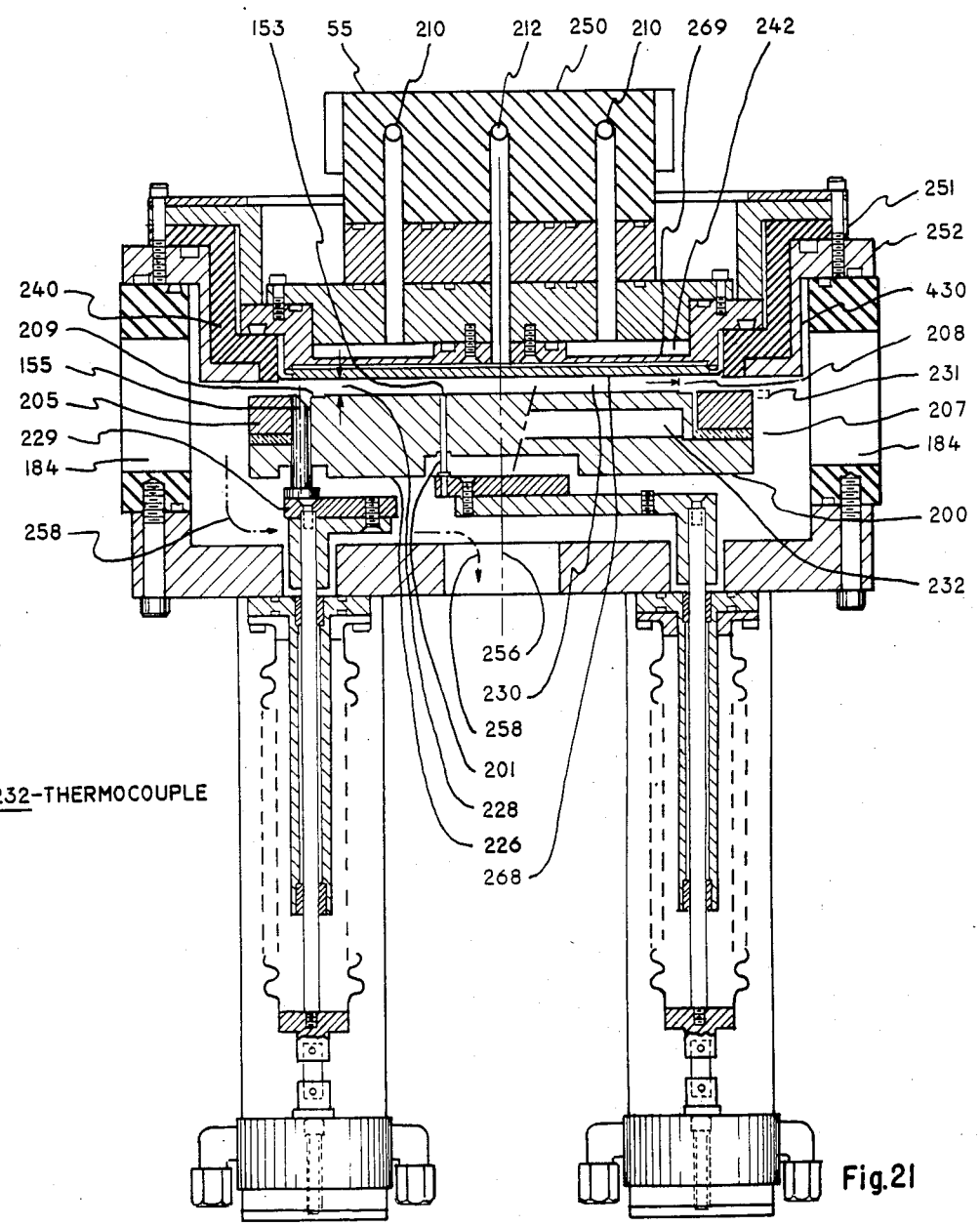
FIG. 21 is a sectional view of the reactor chamber.
Figure 22:
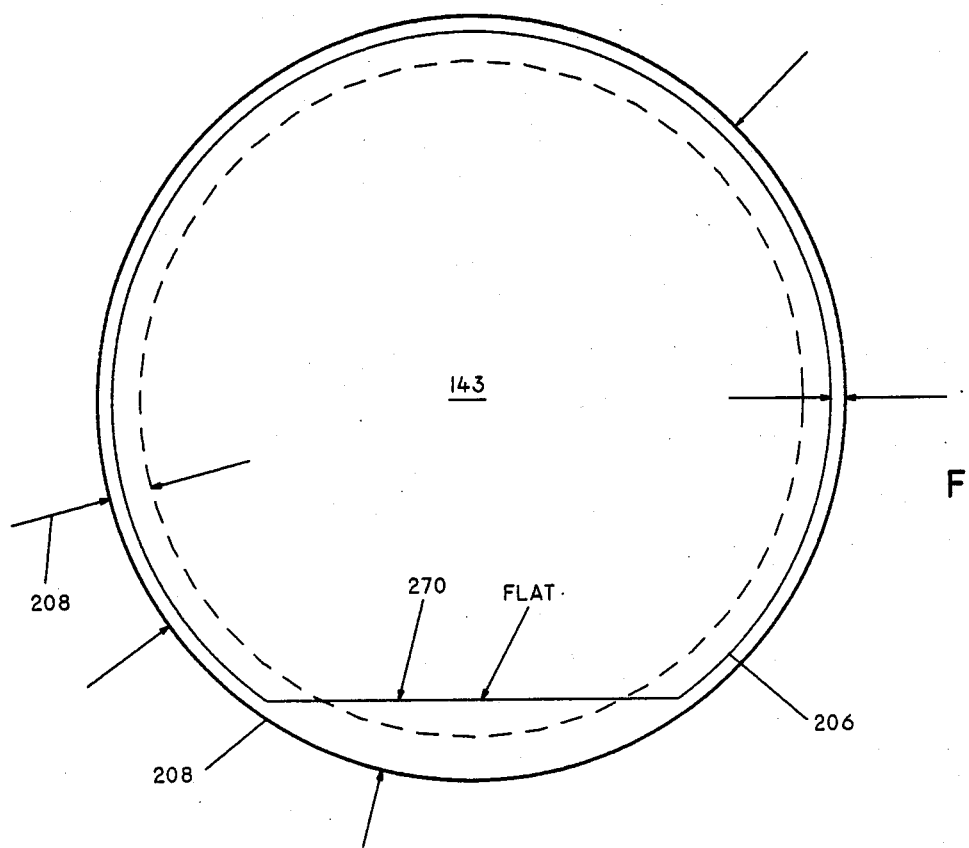

At the completion of the process, the semiconductor wafer is automatically removed from the main chamber 37 by an articulated arm 57 in the exit load lock 59 and placed in the exit load lock for the post-etching process. After processing in the post-etching load lock, the semiconductor wafer is moved to the exit elevator cassette 401 by articulated arm 541. Additionally, cooling is provided to the main chamber as well as the post-chamber and the entry chamber via temperature controller 63. Viewing windows 461, 462 allows viewing of the post-etch and pre-etch operation, respectively. FIGS. 21 and 22 are mechanical illustrations of the articulated arm 441 and 541 in which each has a fork 555. The articulated arms are mounted to the power load lock assembly by pedestal 453 and include a central arm section 161 which rotates around axis 163 as was discussed in conjunction with FIGS. 11, 12, and 13.

ELECTRODE AND COLLIMATOR ASSEMBLY

Figure 26:
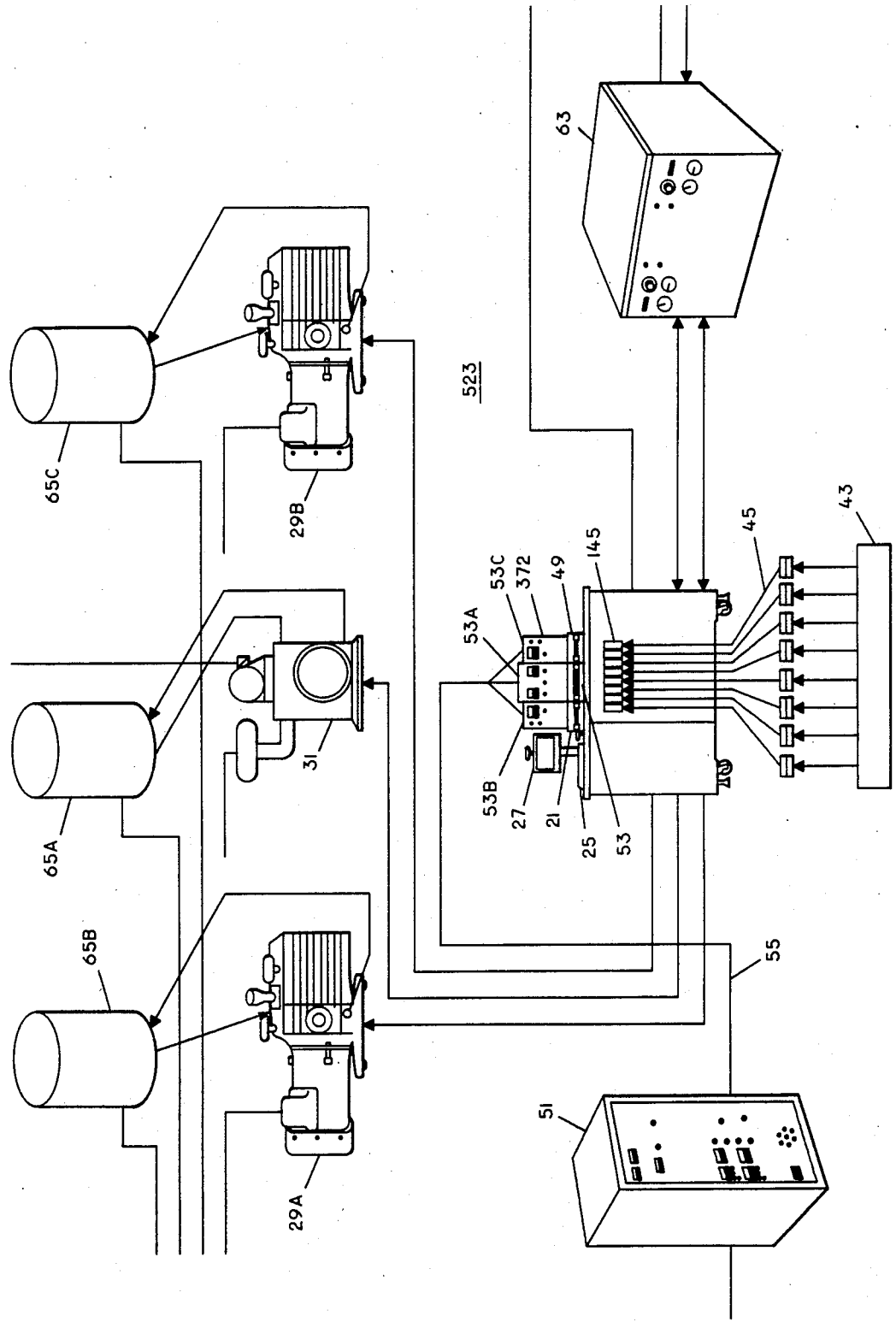
FIGS. 26 through 28 are illustrations of the power load lock reactor.
Figure 27:
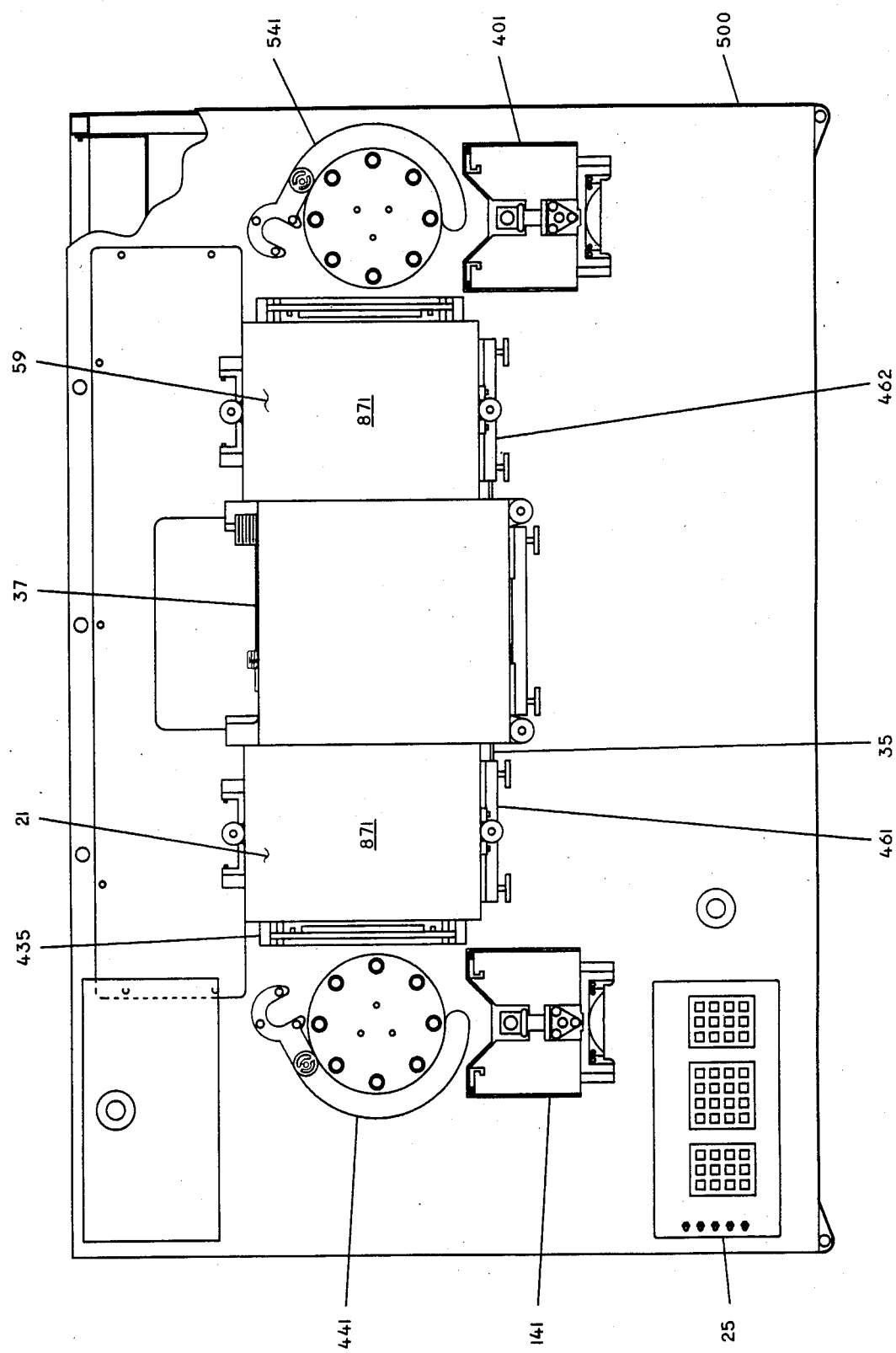
Figure 28:
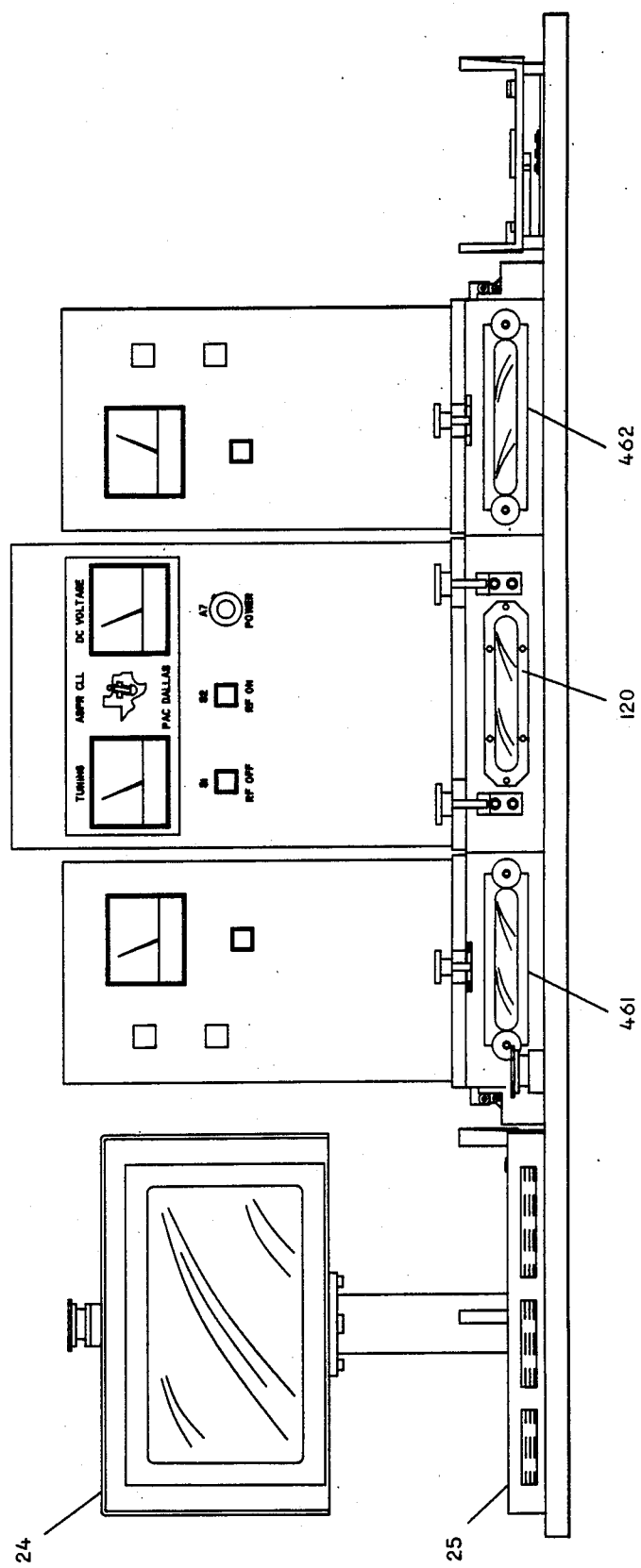

FIG. 21 is a sectional view of the main chamber 37 as seen from section lines 23 of FIG. 19. Initial input of the semiconductor wafer 143 through the opening 145 onto a substrate of wafer plate 206. The wafer plate is in position to allow clearance for the semiconductor wafer 143 and the fork 151 to position the semiconductor wafer over the wafer plate 206. Pins 153 will lift the semiconductor wafer off of the fork 151 and after its removal, lower the semiconductor wafer onto the substrate or wafer plate 206. The embodiment shown in FIG. 26 provides a two position substrate. It is generally accepted that during processing in the powered load lock that the substrate should be at different positions for different modes of operation, such as 0.040 inch for oxide processing. In the case of the cassette load lock, the substrate position is varied only for oxide processing, in all other etching modes the substrate is stationary. To achieve this, the wafer plate 206 has two positions, a low position, which is expanded and a process position.

Figure 25:
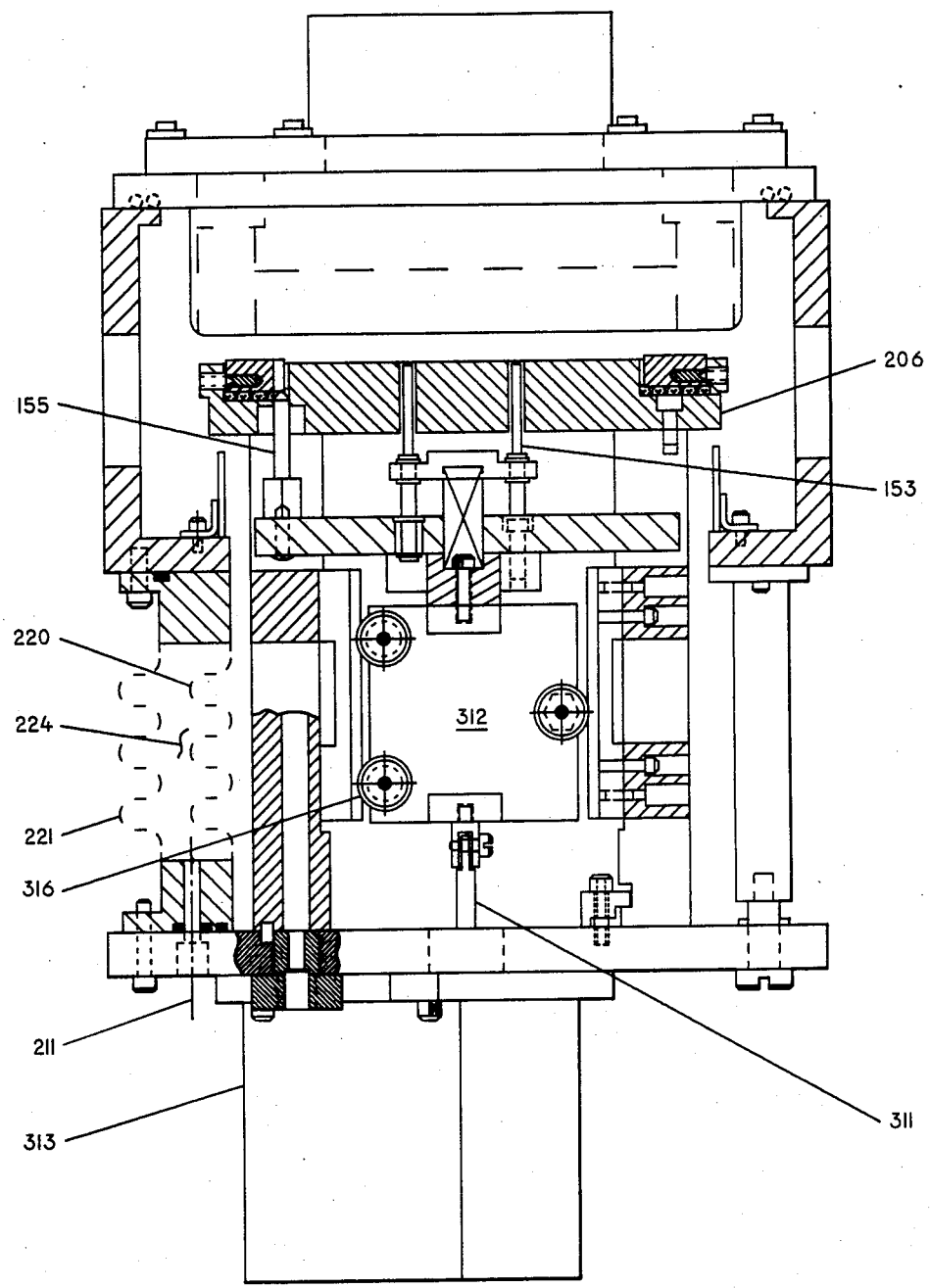
FIG. 25 is a cross sectional view of an alternate embodiment of the reaction chamber.

In the embodiment of FIG. 25, two stainless steel bellows an interbellows 220 and an outer bellows 221 form a chamber between the bellows at 224. By introducing compressed air into lines 211, pressure is built up in the chamber between the bellows and this causes the movement of the substrate 206 to be implemented. Under initial operation, air is introduced into, an air cylinder, not shown, which raises the pins 153 for removal of the semiconductor wafer 153 from the fork 151. The centering pins 155 are raised by introducing air into air cylinder, not shown, which brings the guides 155 into position to center the semiconductor wafer 143 onto the wafer plate 206. The wafer plate 206 is in position for the process which is defined by the opening as indicated by dimension lines 228 between the cathode 230 and the substrate or top of the wafer plate 206. A consistent process gap between the cathode 230 and the substrate 206 is maintained during processing A consistent opening for movement of the semiconductor wafer 143 between the collimater 430 and the substrates 206 is also maintained during slice movement. A constant low pressure (1 TORR) is maintained in the main chamber 37 during slice handling, this eliminates the slice contamination caused by lifting of the main chamber to the atmospheric pressure and facilitates the use of the slice transport arm 141.

Line 212 FIG. 21 is connected to the gas distribution 43 via filters 45 (FIG. 1) and provides for the entrance of gas to be processed in between the cathode 230 and the substrate 206. Lines 210 allow for cooling of the process reaction by the temperature controller 63 to flow through channels 232 and 242 to cool the semiconductor wafer 143 when placed on the wafer plate 206. Ring 205 is an isolation substrate ring that is isolated from the substrate 206 via isolation assembly 207. The ring consists of the body of the ring itself, 205, a retractible slice centering lip 209, isolation mechanism 207 which is made of a metal but with small thermal contact or with an insulator such as teflon which more completely isolates the ring 205 thermally and electrically with a possible ring extension shown at 231. The ring extension 231 is of course to increase the surface area of the top of the ring which increases the area of the overlap between the ring and the collimator itself in the electrode assembly 240.

This extension has been found to improve the effectiveness of the collimator in eliminating plasma expansion beyond the outside ring. The ring 205 is used to provide isolation and to aid in the control of plasma discharge which occurs during the reactor process between the cathode 230 and the substrate 206. The electrode assembly includes an electrode or cathode 230 to which RF voltage is applied via attachment to the plate 250. The electrode or cathode 230 is surrounded by a collimator 430, which includes insulator 251, which is in turn surrounded by a grounded plate 252 to all of which have a cylindrical symmetry about an axis position through the center of the electrode as indicated by line 256. When placed a small distance above a flat grounded substrate 206, the electrode assembly creates a volume as indicated by dimension lines 228 which can effectively confine a high power density plasma, while maintaining a sufficient channel for flowing gas through the lines 212 in the direction as indicated by arrows 258 and for observing the plasma optically through the window 120. As discussed earlier, the chamber can be widened for automatic transport of the semiconductor wafers from outside of the main chamber 137. By having a confined high power density plasma, high rate uniform anisotropic etching, especially for silicon dioxide and silicon nitrides, can be achieved. The ring 208 has an annulus of a width equal to the distance between the placement pins 155 and pin 209 and is an area which is generally exposed to plasma due to the fact that most semiconductor wafers have a flat portion that is used for alignement. The reacting plasma will attack the semiconductor wafer plate 206 or substrate and create damages. In FIG. 22, by anodizing an area 208 around the substrate 206, an area in width as indicated by dimension lines 270 will prevent etching of the substrate 206 when as shown in FIG. 21, a semiconductor wafer 143 is placed on the substrate 206. In general, the substrate 206 is manufactured with aluminum which is highly corrosive if not protected by anodization.

Figure 24:
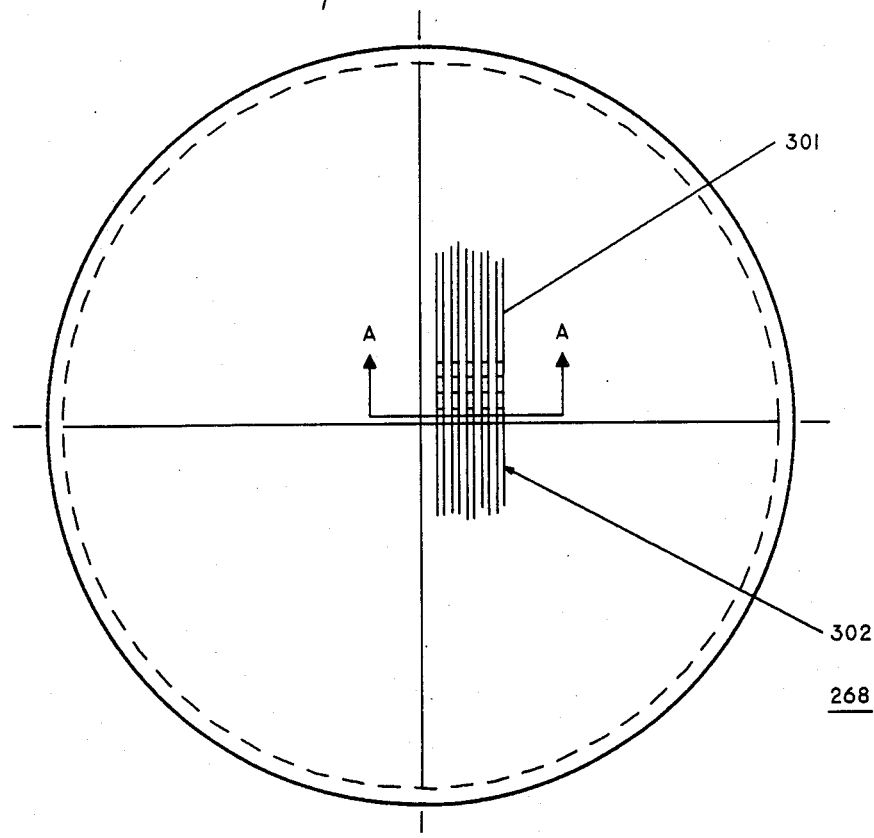
Figure 23:
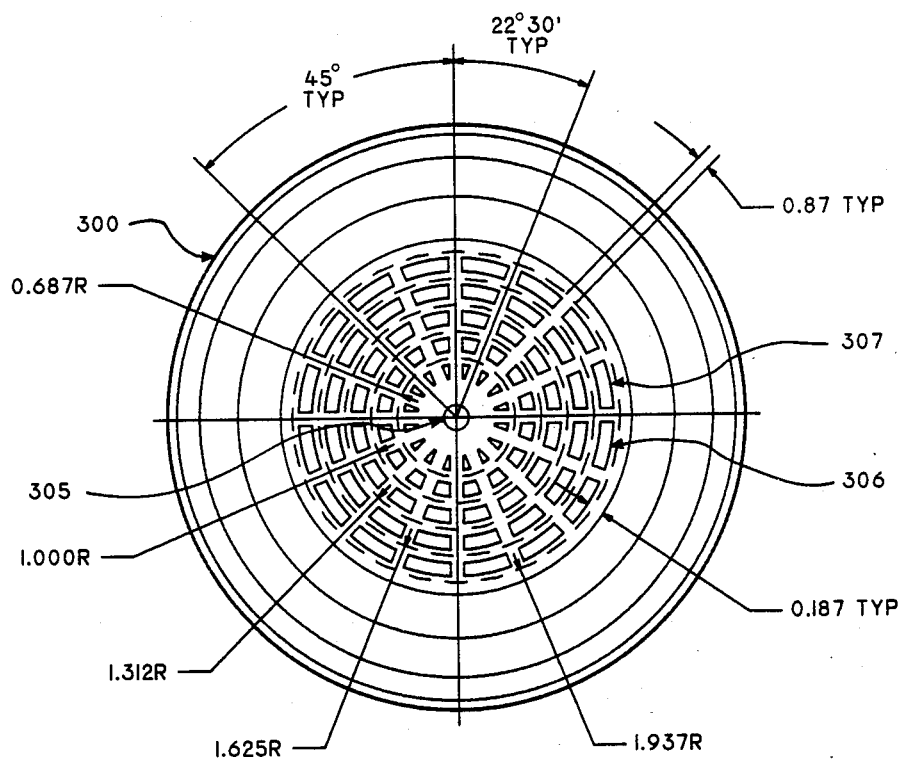
FIG. 23 is a top vie of the plasma plate illustrating an anodized ring.

The cathode assembly 230 of FIG. 21 is shown in FIGS. 24 and 24 and includes a top plate 269 and a bottom plate 268. The top plate 269 has a gas inlet 305 to allow the cooling gas to enter via from line 212 and a water cooled line 304 which removes heat from the plate 268. Recess gas flow channels are provided at 307 and areas 306 provide for thermal contact between the bottom plate 269 and the top plate 268. The bottom plate 269 is illustrated in FIG. 23 and the top plate 268 is illustrated in FIG. 24. The thermal contact area must be maximized without restricting the gas flow. This is illustrated in the top plate where there are many drilled holes in area 301 and the lines in 302 allow for gas flow channels for the top plate 268.

FIG. 25 is alternate embodiment of the substrate 206 which has dual positions. The alignment pins 155 and lift off pins 153 are controlled by lifting of the carriage assembly 312 which is guided into place by wheels 310. The carriage assembly 312 is lifted by the levers 311 being raised under compressed air applied to a cylinder contained within a housing at 313. The positioning of the substrate 206 is accomplished by feeding air in between an interbellows 220 and an outer bellows 220 into a chamber 212 at air ducts 211 which causes the wafer plate 206 to be raised or contracted depending upon the air pressure that is contained within the air chamber 224.

Insert E - Powered Load Lock Reaction

Figure 29:
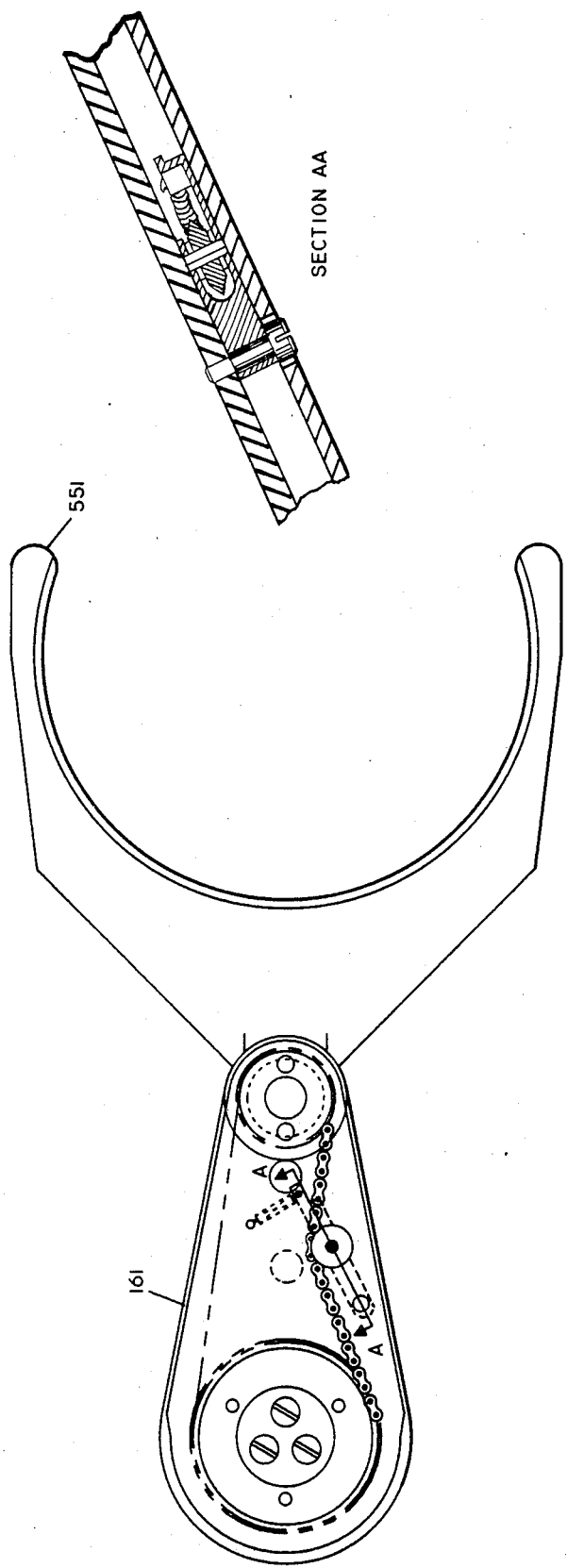
FIGS. 29 and 30 are illustrations of the power load lock slice handler arm.
Figure 30:
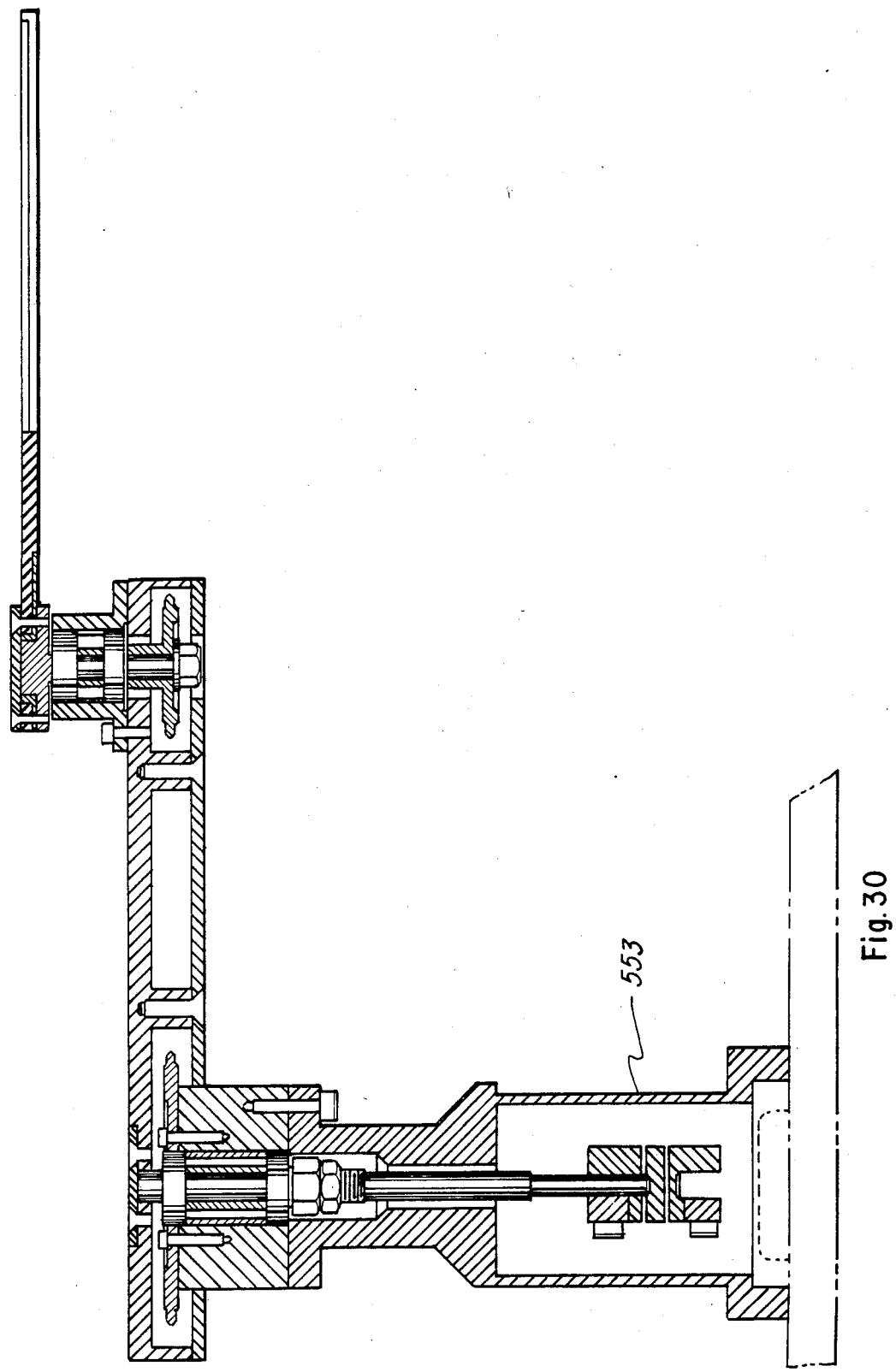
Figure 31:
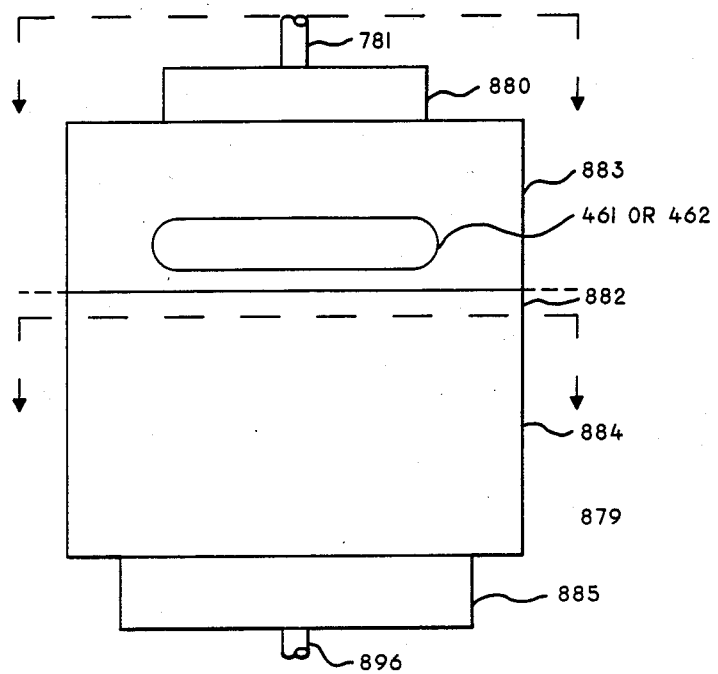
FIGS. 31 through 34 are diagrams of the powered load lock chambers.
Figure 32:
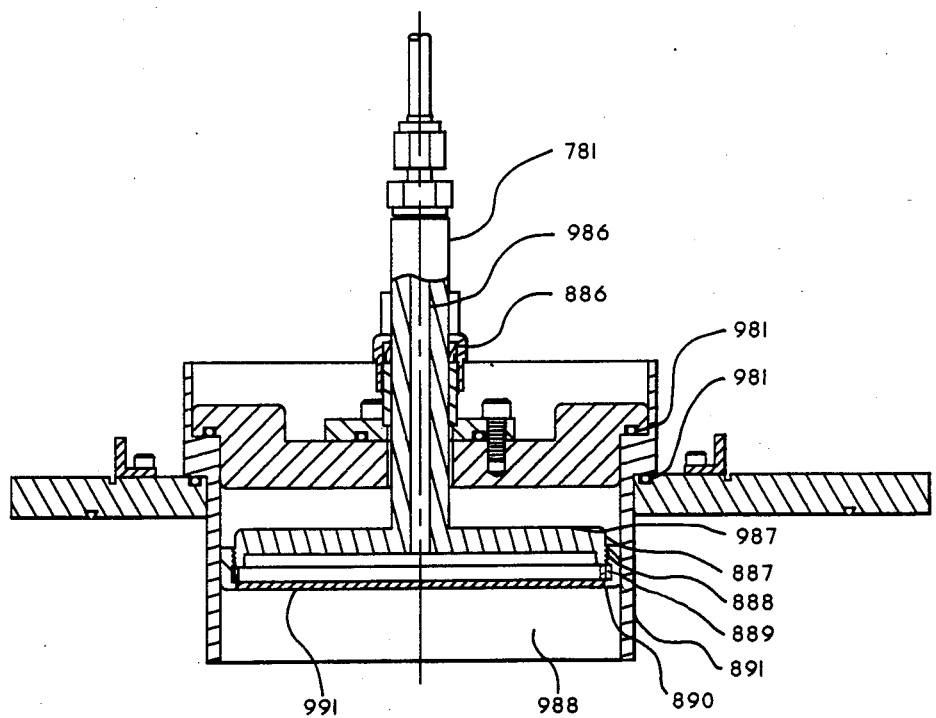
Figure 33:
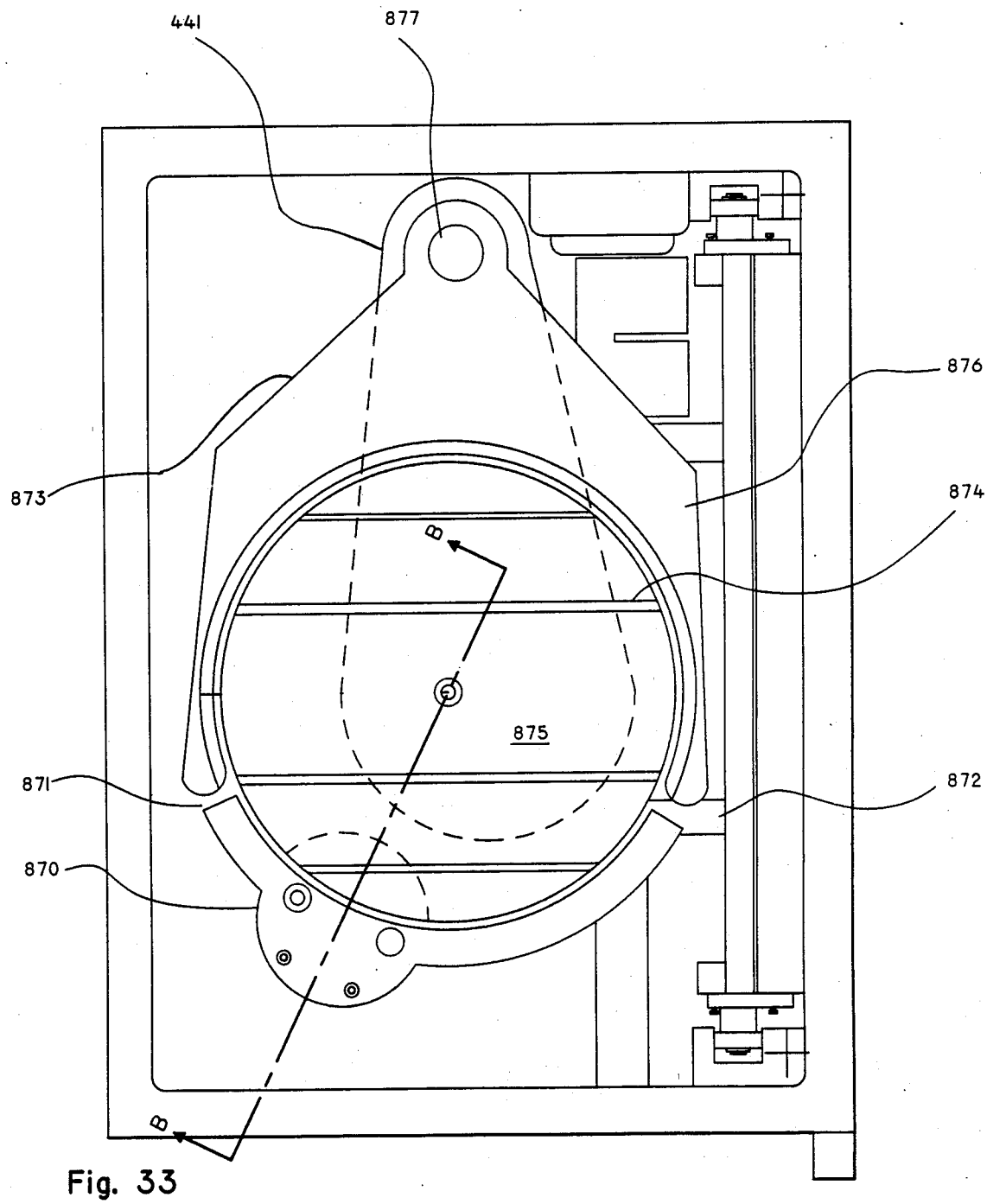

FIGS. 31 through 34 illustrate the load lock chambers which provide for pre-etch processing in the entrance load lock through a plasma assisted reaction, and post-etch processing in the exit load lock through a plasma assisted reaction. In FIGS. 31 and 32 the gas from the gas distribution manifold 760 is applied by line 781 through a baffling port 999. The feedthrough 886 as shown in FIG. 32 provides for movement of tubing 781 to provide for adjustable spacing of the electrode assembly 987 to control the volume of reactants area 988. This is illustrated in FIG. 32. In addition to the tubing 786, the electrode assembly 987 includes feedthrough 886 and O ring seals 981 and includes a gas distribution assembly 889, a retainer 888 that holds the electrode 890 onto the gas distribution assembly 889. The retainer 888 also seals the electrode assembly 987 to the walls of the collimator 891, which is made of insulating materials. The gas is distributed through the electrode 890 by means of plurality of distribution holes 991. The slice handling mechanism which is shown at 882 has a fork 873 which lifts a slice from outside of the load lock chamber and centers it on ring 876 and then rotates around axis 877 to position the slice over the bottom electrode 875. The spacing 871 and 872 is ⅛th of an inch so as to minimize its effect on the plasma that is contained within volume 988. The slice handler 441 was discussed in conjunction with FIGS. 29 and 31. The substrate 875 has cooling channels 879 to facilitate the cooling of its semiconductor slice that is mounted to the substrate during its reaction. Function 870 is designed and positioned so as to ensure that the gaps 871 and 872 are at a minimum.

Figure 34:
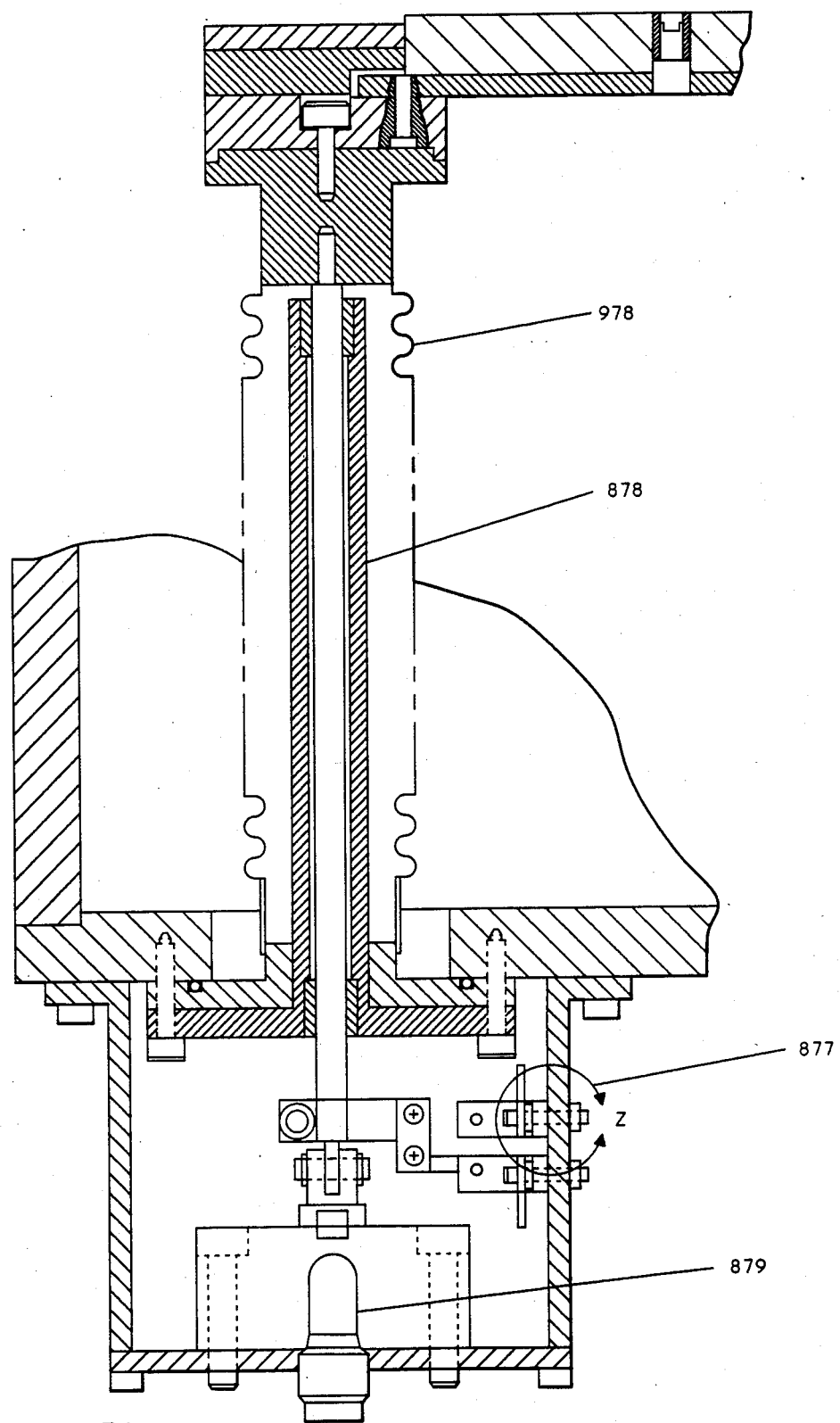

FIG. 34 illustrates the bottom electrode in which the reactant gases are removed from via line 896 which goes to vacuum pumps 29a or 29b and includes a mechanical housing 885 and a bellows chamber 884. Within the bellows chamber 884 is a bellows assembly 878 which moves the bottom substrate 875 by the operation of an air cylinder pressing shaft 978 in the upper or lower position. The compressing of the bellows 878 positions the substrate 875 to ensure the proper reaction as was discussed in conjunction with the main chamber.

Although the embodiments of the invention have been described with some particularity, one skilled in the art would know that the substitution of elements will not depart from the scope of the invention as limited to the appended claims.

We claim:

1. An apparatus for the manufacturing of semiconductor devices from semiconductor wafers having a plurality of semiconductor circuit patterns on at least a reacting surface of the semiconductor wafer, the apparatus comprises:
    reacting means for providing a stream of reacting gases to react with the semiconductor wafer to create circuit elements according to the semiconductor circuit pattern thereby;
    handling means for handling the wafers and includes a chamber means for bringing the wafers into contact with the reacting gas, degassing means for degassing of the semiconductor wafers, port means for preventing the contamination of the chamber means and to provide a port for the transfer of the semiconductor wafers from the degassing means to the chamber means; port means for isolating the semiconductor wafers and the circuit elements from the chamber means, second port means for providing a port for the transfer of the semiconductor wafer between the chamber means and the port means, and transfer means for transferring the semiconductor wafer from the degassing means to the chamber means and from the chamber means to the port means; and wherein the transfer means includes;
    a reacting opening into the chamber means, and a valve for opening and closing of the opening into the chamber means;
    means for controlling the operation of the apparatus.

2. The apparatus according to claim 1 wherein the reacting means comprises:
    gas means for providing a plurality of gases; and
    ion means for ionizing predetermined members of the plurality of gases.

3. The apparatus according to claim 1 wherein a chamber means comprises:
    plasma means for generating a plasma; and
    means for varying the volume means for varying the volume of the chamber means.

4. The apparatus according to claim 1 wherein the valve consists of a sealed plate for sealing of the opening;
    a backing plate for backing of the seal plate against the opening and a camming mechanism for camming the packing plate, and the seal plate into a locked position.

5. The apparatus according to claim 1 wherein the degassing means and the port means each includes:
    wafer storing means for storing of a plurality of semiconductor wafers.

6. The apparatus according to claim 1 wherein the chamber means and port means further includes:
    means for bringing the semiconductor wafers into contact with reactant gases.

* * * * *